United States Patent
Ohsaka et al.

(10) Patent No.: US 6,205,010 B1
(45) Date of Patent: *Mar. 20, 2001

(54) SWITCH CIRCUIT HAVING PROTECTION FUNCTION TO INTERRUPT INPUT OF CONTROL SIGNAL

(75) Inventors: Ichiro Ohsaka, Kawasaki; Tatsuya Yoshida, Urizura; Mitsuru Kon'i, Hitachinaka; Kaneyuki Okamoto, Hitachinaka; Mitsuhiko Watanabe, Hitachinaka, all of (JP)

(73) Assignees: Hitachi, Ltd., Tokyo; Hitachi Car Engineering Co., Ltd., Hitachinaka, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/970,755

(22) Filed: Nov. 14, 1997

(30) Foreign Application Priority Data

Nov. 14, 1996 (JP) ..................................................... 8-303018

(51) Int. Cl.$^7$ ............................... H02H 3/02; H02H 5/04
(52) U.S. Cl. ......................... 361/103; 361/101; 327/512; 307/117
(58) Field of Search ................................. 361/54, 56, 73, 361/75, 103, 94, 97, 100, 101, 106, 27, 25, 28; 327/512, 513

(56) References Cited

U.S. PATENT DOCUMENTS

| 4,719,531 | * | 1/1988 | Okado et al. | ............................ 361/86 |
| 5,162,669 | * | 11/1992 | Hobelsberger | ......................... 327/512 |
| 5,485,341 | * | 1/1996 | Okado et al. | ............................ 361/98 |
| 5,563,759 | * | 10/1996 | Nadd | ..................... 361/101 |
| 5,638,021 | * | 6/1997 | Kaifler et al. | ......................... 327/513 |

FOREIGN PATENT DOCUMENTS

| 61-261920 | 11/1986 | (JP) . |
| 62-11916 | 1/1987 | (JP) . |
| 62-143450 | 6/1987 | (JP) . |
| 63-87128 | 4/1988 | (JP) . |
| 63-170145 | 7/1988 | (JP) . |
| 1-181474 | 7/1989 | (JP) . |
| 2-135818 | 5/1990 | (JP) . |
| 7-221261 | 8/1995 | (JP) . |

* cited by examiner

*Primary Examiner*—Michael J. Sherry
*Assistant Examiner*—Kim Huynh
(74) *Attorney, Agent, or Firm*—Evenson, McKeown, Edwards & Lenahan, P.L.L.C.

(57) ABSTRACT

In an electric power switch circuit with an overcurrent or overheating protection function, unnecessary ON-OFF cycling is prevented. A MOSFET is used as an electric power element for energizing a load according to a control signal. A temperature detector detects the temperature in the neighborhood of the MOSFET, and a control unit opens a switch, interrupting input of the control signal to the MOSFET when the temperature detected by the temperature detecting means is higher than the predetermined temperature. An interruption status retaining device maintains the interruption of the control signal, preventing repetitive ON-OFF cycling.

15 Claims, 24 Drawing Sheets

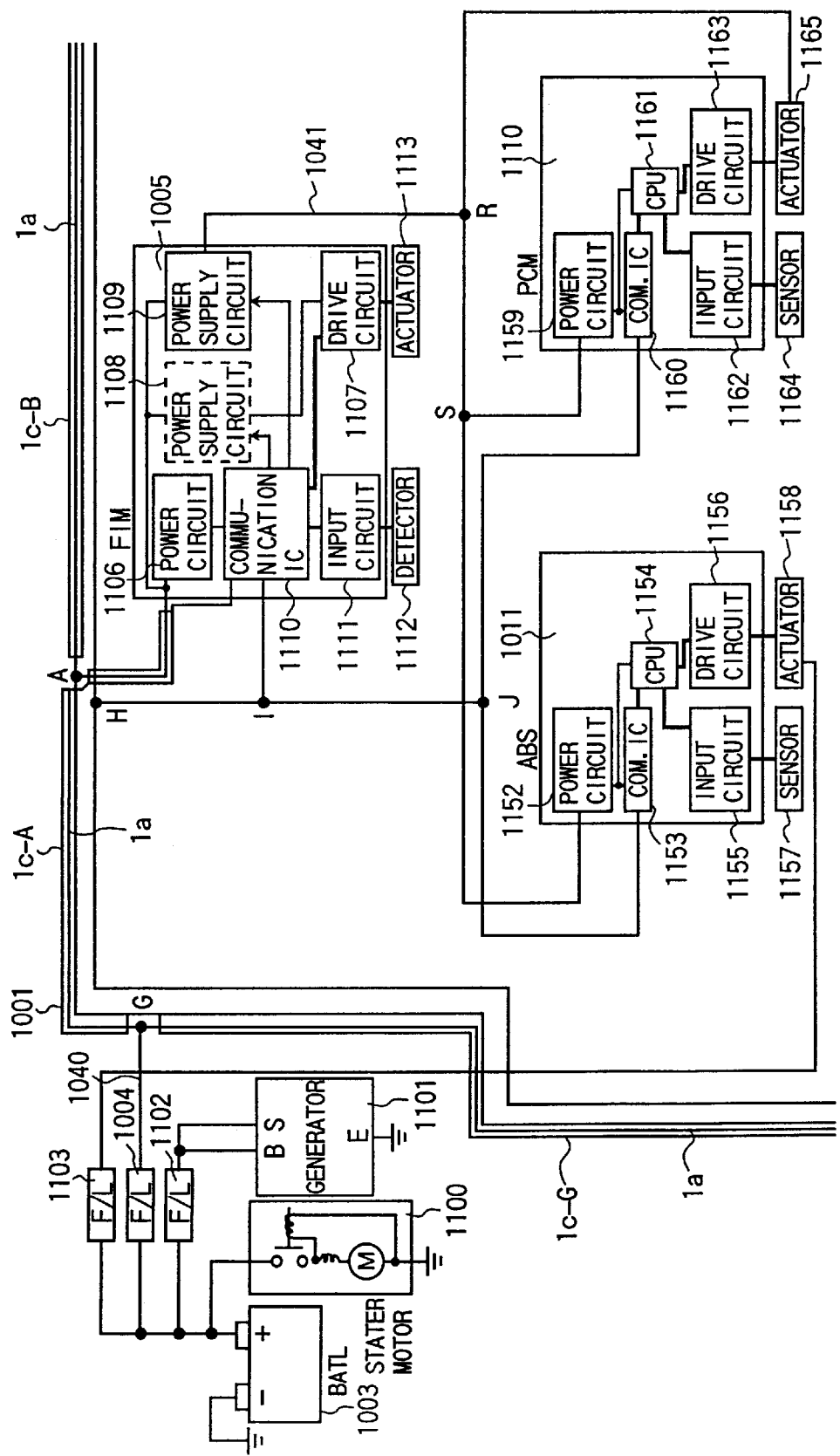

SWITCH CIRCUIT HAVING PROTECTION FUNCTION TO INTERRUPT INPUT OF CONTROL SIGNAL

BACKGROUND OF THE INVENTION

The present invention relates to a switching apparatus having an overcurrent or overheating protection function, using an electric power semiconductor element which controls the ON-OFF switching operation of a load, and also detects an overload and moves to an automatic interruption mode. More particularly the invention relates to a switch circuit having a protection function, which is suited to control turning a lamp or motor of a car ON or OFF.

A conventional switch circuit with a protection function, having a system for detecting an over-current supplied to a load and automatically interrupting it is generally known. Examples in which the system is applied using a MOS-FET switch circuit are described in, for example, Japanese Patent Application Laid-open 61261920, Japanese Patent Application Laid-open 62-11916, Japanese Patent Application Laid-open 62-143450, and Japanese Patent Application Laid-Open 63-87128, and Japanese Patent Application Laid-Open 63-170145.

However, if a lamp using a tungsten or other filament as a load is used, when the switch circuit is turned on so as to light the lamp, a sharp surge of starting current flows. The reason is that before the lamp lights, the resistance of the filament (at a comparatively low temperature) is low; therefore, when the lamp lights, current rises sharply, and decreases thereafter, due to an increase in the resistance. Thus, in the conventional switch system with over-current protection, the protection function is triggered by the starting current, and a normal lighting operation cannot be performed. Even if a motor is used as a load, when power is supplied to the motor, a large current surge occurs, so that the protection function of the switch circuit is activated and a normal motor driving operation cannot be performed.

In another system, the temperature of an electric power element (switch circuit) is detected, and when the power element is overheated more than the predetermined temperature, the protection function is performed. A switch circuit having such a protection function is described in, for example, Japanese Patent Application Laid-open 2-135818t Japanese Patent Application Laid-Open 1-181474, and Japanese Patent Application Laid-open 7-221261. In these switch circuits, even in the case of a current surge when the lamp lights or the motor starts, no unnecessary protection function is performed, because the time response for temperature rise is slow; thus, a normal lamp lighting operation or a motor starting operation can be performed. By contrast, if a malfunction involving a locking of the motor occurs, the temperature rises and the switch circuit is interrupted.

However, in a conventional overcurrent protected switch circuit which uses a temperature detection system, even if overheating is detected when an error occurs, and the switch circuit is therefore properly interrupted, there is a problem that an ON-OFF cycle occurs, in which the protection function is recovered due to a reduction in the temperature, and thereafter the temperature rises again, so that the cycle is repeated.

SUMMARY OF THE INVENTION

An object of the present invention is to provide a switch circuit having a protection function in which the unnecessary ON-OFF cycle is not repeated.

To accomplish the above object, the switch circuit comprises an electric power element for receiving an input control signal via a switch, energizing according to the control signal, and supplying power to a load; a temperature detecting means for detecting the temperature in the neighborhood of this electric power element; and a control means for opening the aforementioned switch and interrupting input of the control signal to the electric power element when the temperature detected by this temperature detecting means is higher than the predetermined temperature. The switch circuit has an interruption status retaining means, for maintaining the interruption of the control signal to the electric power element, so that repetition of the unnecessary ON-OFF cycle can be eliminated.

In one embodiment of the aforementioned switch circuit, the interruption status retaining means is provided in the control means and has a retaining means for retaining an interruption signal outputted to the switch by the control means, so that repetition of the unnecessary ON-OFF cycle can be eliminated.

In another embodiment of the aforementioned switch circuit, the interruption status retaining means is provided in the temperature detecting means and has a retaining means for retaining the maximum temperature detected by the temperature detecting means, so that repetition of the unnecessary ON-OFF cycle can be eliminated.

According to another feature of the invention, the switch circuit has a resetting means for canceling the interruption status of the interruption status retaining means, so that current supply to the load can be restarted. This may be done on the basis of the control signal.

According to another embodiment, the resetting means cancels the interruption status of the interruption status retaining means when the temperature detected by the temperature detecting means reaches a predetermined interruption canceling temperature, so that an unnecessary overcurrent can be prevented from flowing to the load.

According to another feature of the invention, the switch circuit may have a reset stopping means for preventing the reset of the resetting means when a predetermined time elapses after the control signal inputted to the electric power element enters the interruption state, so that the power consumption can be reduced According to still another feature of the invention, the switch circuit has an input controller for superposing a reset signal on a signal inputted to the electric power element in a predetermined timing, and sends an output signal of the input controller means to the electric power element. In this manner, even an instantaneous short-circuit of a load can be reset.

In another embodiment of the invention, the input controller superposes the reset signal only during the time when the control signal energizes the electric power element. Alternatively, the input controller means may superpose the reset signal during the whole term of the control signal.

According to yet another feature of the invention, the reset signal may be superposed on the aforementioned signal according to a timing whose interval increases gradually. In this manner, damage by heat generated due to a rush current at the time of short-circuit can be reduced.

In still another embodiment of the invention, the switch changes over the path through which the control signal is supplied to the electric power element and the path for setting the control terminal of the electric power element at the grounding potential, so that the time required to turn the electric power element off can be shortened.

Finally, in yet another embodiment of the invention, the switch changes over the path through which the control signal is supplied to the electric power element, and the path for connecting to the current source for pulling out terminal of the electric power element. In this way, the time required to turn the electric power element off can be shortened.

Other objects, advantages and novel features of the present invention will become apparent from the following detailed description of the invention when considered in conjunction with the accompanying drawings.

BRIEF DESCRIPTION OF THE DRAWINGS

FIGS. 30A, 30B, 30C are block diagrams of an electric power supplying apparatus as an another embodiment of the present invention;

PREFERRED EMBODIMENTS OF THE PRESENT INVENTION

Figure 1:
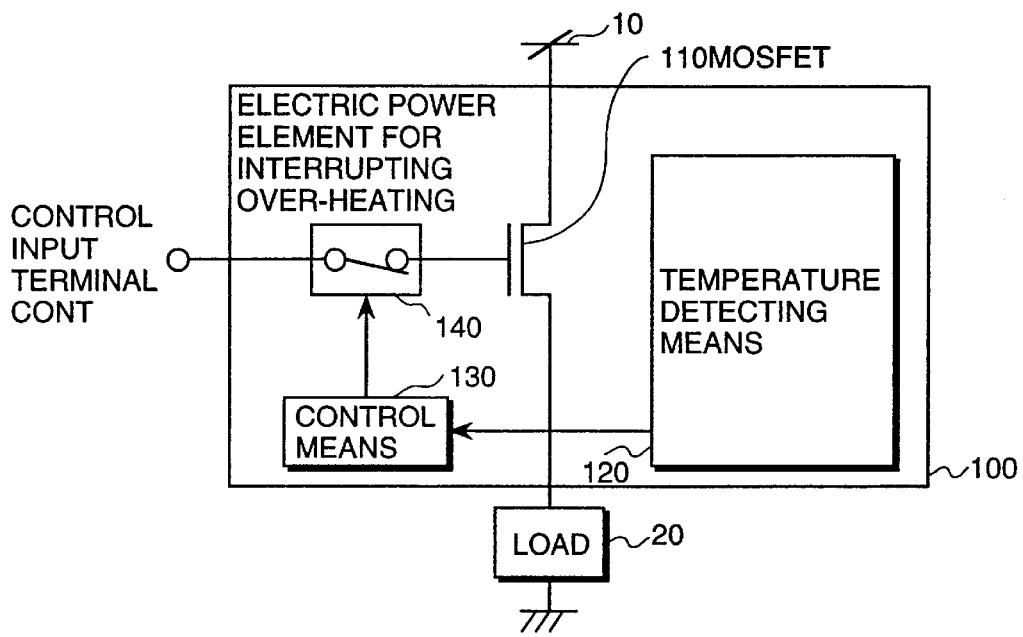
FIG. 1 is a block diagram of the switch circuit having a protection function of an embodiment of the present invention.

The constitution and operation of a switch circuit having a protection function of an embodiment of the present invention will be explained hereunder by referring to FIGS. 1 to 3.

Firstly, the overall constitution of an overcurrent protected switch circuit according to an embodiment of the present invention will be explained by referring to FIG. 1. An electric power element 100 having a function to interrupt over heating is connected between a power source 10 and a load 20, and controls the supply and interruption of power to the load 20 from the power source 10 according to a control signal inputted from a control input terminal CONT. The load 20, for example, may be a load in which a sharp starting current flows, such as during lighting operation of an incandescent lamp or starting of a motor during running operation. In a car, the load 20 may be a lamp having large power consumption (like a head lamp or a stop lamp) or a motor having large power consumption, such as a wiper motor or a power window motor.

The electric power element having function to interrupt over heating 100 comprises an MOSFET 110, a temperature detecting means 120, a control means 130, and a switch 140. The MOSFET 110 is an electric power element performing a switching operation according to a control signal from the control input terminal CONT. The temperature detecting means 120 detects the channel temperature of the MOSFET 110 and outputs a signal corresponding to the detected temperature. The detailed constitution of the temperature detecting means 120 will be described later by referring to FIG. 3.

The control means 130 receives a temperature detection signal from the temperature detecting means 120, and outputs a control output signal for performing a protection operation, interrupting continuity to the load 20, when the detected temperature becomes higher than a predetermined temperature. The control means 130 in this embodiment has a function for retaining such interruption status, and outputs a control output signal for continuously retaining the interruption status, even if the temperature detected by the temperature detecting means 120 is lower than the predetermined temperature. The detailed constitution of the control means 130 will be described later by referring to FIG. 3.

The switch 140 is connected between the control input terminal CONT and the gate of the MOSFET 110 and performs a switching operation, supplying or interrupting the transmission of a control signal from the control input terminal CONT to the gate of the MOSFET 110, according to a signal outputted from the control means 130.

Figure 2A:
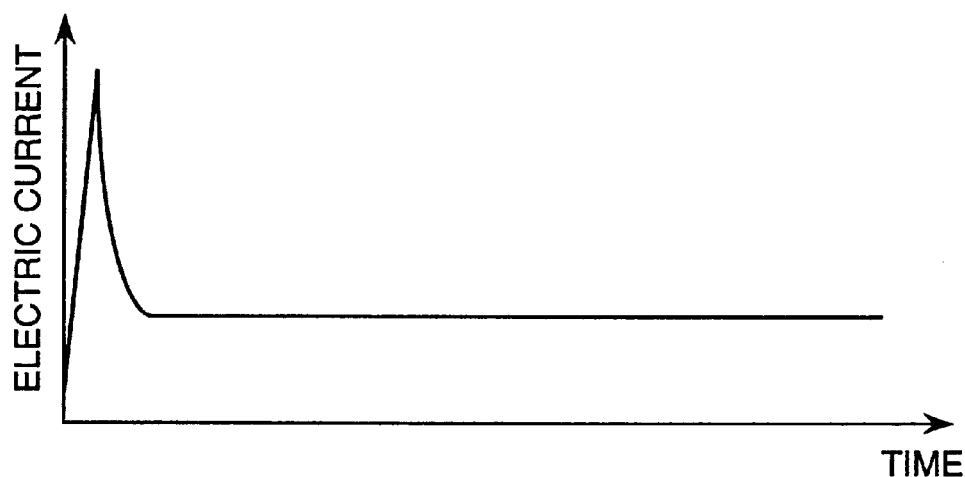
FIGS. 2A and 2B are waveform diagrams for explaining the operation of the switch circuit having a protection function of an embodiment of the present invention.
Figure 2B:
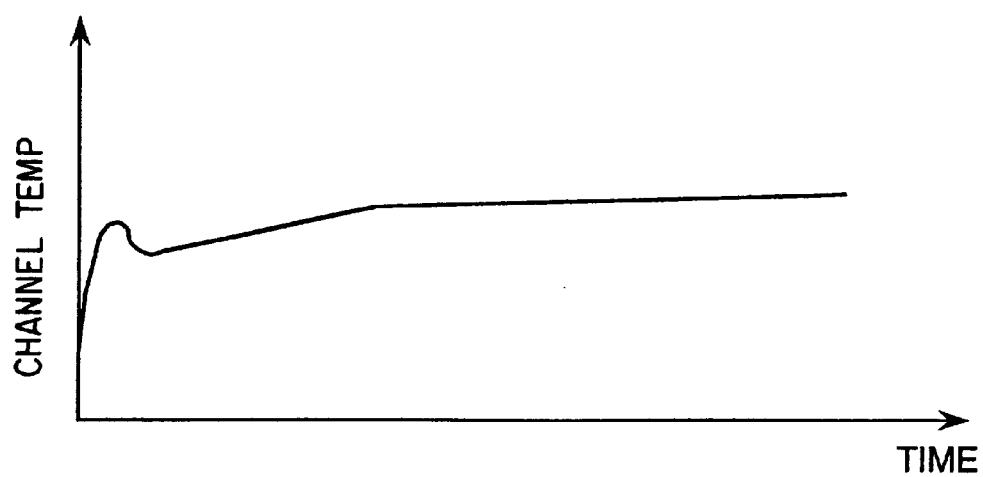

FIG. 2 shows waveform diagrams for explaining the operation of the switch circuit having a protection function of an embodiment of the present invention.

The switch 140 shown in FIG. 1 is generally energized and when a control signal from the control input terminal CONT enters, for example, high level, the switch 140 supplies the control signal to the gate of the MOSFET 110, energizes the MOSFET 110, and supplies power to the load 20 from the power source 10. If the control signal inputted from the control input terminal CONT enters low level when the switch 140 is closed, the switch 140 makes the MOSFET 110 non-conductive and stops power supply to the load 20 from the power source 10.

When the load 20 is a lamp or a motor as shown in FIG. 2 (A), the current flowing in the load 20 after the power supply start to the load 20 is large, rising instantaneously sharply. Thereafter, the current is settled to a steady state current. The conventional method of protecting against an over-current detects this large current, performs the protection function, and interrupts the MOSFET the electric power element, so that the normal power supply operation cannot be performed.

On the other hand, as shown in FIG. 2 (B), the channel temperature of the MOSFET 110 changes. Namely, the rising temperature of the channel due to the current surge does not show a large peak compared with the current because it is diffused by the heat capacity and thermal conduction of the semiconductor in the neighborhood of the channel.

In this case, when the current flowing in the load 20 is excessive and heat generation of the channel is continued, heat is transferred to the lead frame package and external heat radiation board from the semiconductor chip of MOSFET 20. In this process, the temperature detecting means 120 installed in the neighborhood of the channel detects the temperature in the neighborhood of the channel and outputs temperature information to the control means 130.

The control means 130 inputting the temperature information compares the inputted temperature information with the predetermined interrupting temperature. When the control means 130 judges that the temperature information is higher than the predetermined interrupting temperature, it controls the switch 140 and cuts off an input signal to the MOSFET 110. The MOSFET 110 for which the input is cut off is turned off, the drain current is interrupted, and the current supply to the load 20 is interrupted. According to the invention, the control circuit 3 controls so as to retain the interruption status of the switch 140 even if the temperature lowers.

As explained above, the electric power element 100 having a function to interrupt over heating of this embodiment is not triggered by the current surge at the time of power supply start, but operates by the steady state current. Particularly in a lamp or a motor which is often used in a car, the current surge is large, so that it is controlled by using an electric power element having function to interrupt over heating as indicated in this embodiment. The interrupting temperature is set so as to be lower than breakdown temperature of the electric power element.

Next, the constitution and operation of the temperature detecting means 120 and the control means 130 will be explained by referring to FIG. 3.

Figure 3:
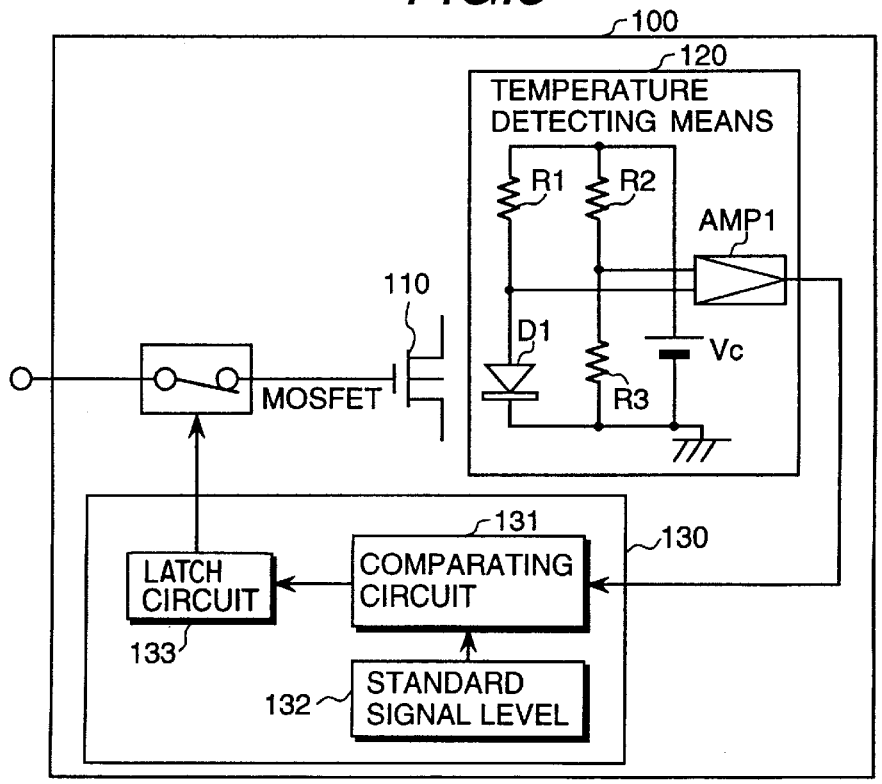
FIG. 3 is a block diagram showing the actual constitution of a temperature detecting means and a control means used in the switch circuit having a protection function of an embodiment of the present invention.

FIG. 3 is a block diagram showing an actual constitution of the temperature detecting means 120 and the control means 130 used in the switch circuit having a protection function of an embodiment of the present invention.

The temperature detecting means 120 comprises a bridge circuit having resistors R1, R2, and R3, a diode D1, a constant voltage source Vc, and a differential amplifier AMP1. The diode D1 comprises PN junction and is arranged in the neighborhood of the MOSFET 110 on the chip. The PN junction of the diode D1 is such that the forward voltage is dependent upon temperature. Therefore, when the channel of the MOSFET 110 generates heat, the bridge circuit becomes unbalanced due to the temperature dependency of the forward voltage of the PN junction of the diode D1. When the unbalance of the bridge circuit is amplified by the differential amplifier AMP1, the temperature detecting means 120 can output a temperature information signal to the control means 130.

The control means 130 comprises a comparator circuit 131, a standard signal level circuit 132, and a latch circuit 133. The standard signal level circuit 132 outputs a standard signal, corresponding to the temperature at which the electric power element 100 performs the overheating interruption protection operation, to the comparator circuit 131. The comparator circuit 131 receives the latter signal and the temperature information signal outputted by the temperature detecting means 120, and when the temperature information signal is larger than the standard signal, the comparator circuit 131 outputs an interruption signal on the high level. The latch circuit 133 latches this interruption signal and outputs it to the switch 140. Since the latch circuit 133 retains this interruption signal continuously, the electric power element having a function to interrupt over heating 100 can maintain the interruption status.

Therefore, when the control means detects that an over-current flows in the load 20 and the temperature of the MOSFET 110 detected by the temperature detecting means 120 is higher than the predetermined interrupting temperature, the control means opens the switch 140, interrupting the supply of the signal from the control input terminal CONT to the MOSFET 110, thereby rendering the MOSFET non-conductive, and interrupting power supply to the load 20.

Even if the temperature of the MOSFET 110 falls after the power supply to the load 20 is interrupted, the latch circuit 133 of the control means 130 retains the interruption signal. Therefore, the interruption status is continued and the electric power element 100 cannot repeat the unnecessary ON-OFF cycle.

In the aforementioned explanation, to detect the channel temperature of the MOSFET 110, the temperature dependency of the forward voltage of the PN junction of the diode D1 is used. However, it is possible to use a semiconductor resistor in place of the diode D1 and use the temperature dependency of the semiconductor resistor. in this case, the semiconductor resistor is formed and arranged in the neighborhood of the MOSFET 110 on the chip. The temperature dependency of the forward voltage of the diode D1 is larger than the temperature dependency of the semiconductor resistor.

Furthermore, it is possible to form and arrange a single diode D1 in the neighborhood of the MOSFET 110 or form and arrange a single semiconductor resistor in the neighborhood of the MOSFET 110 in place of the bridge circuit constitution. The bridge circuit can increase the output of the temperature information signal.

As explained above, according to this embodiment, even if a current surge flows in the load, the electric power element having a function to interrupt over heating detects the temperature rise caused by an overcurrent flowing in the load. When an error occurs in the load in the absence of a malfunction, due to the current surge, it performs a protection operation for the load; after power supply to the load is interrupted, the electric power element retains the interruption status and does not repeat the unnecessary ON-OFF cycle.

Figure 4:
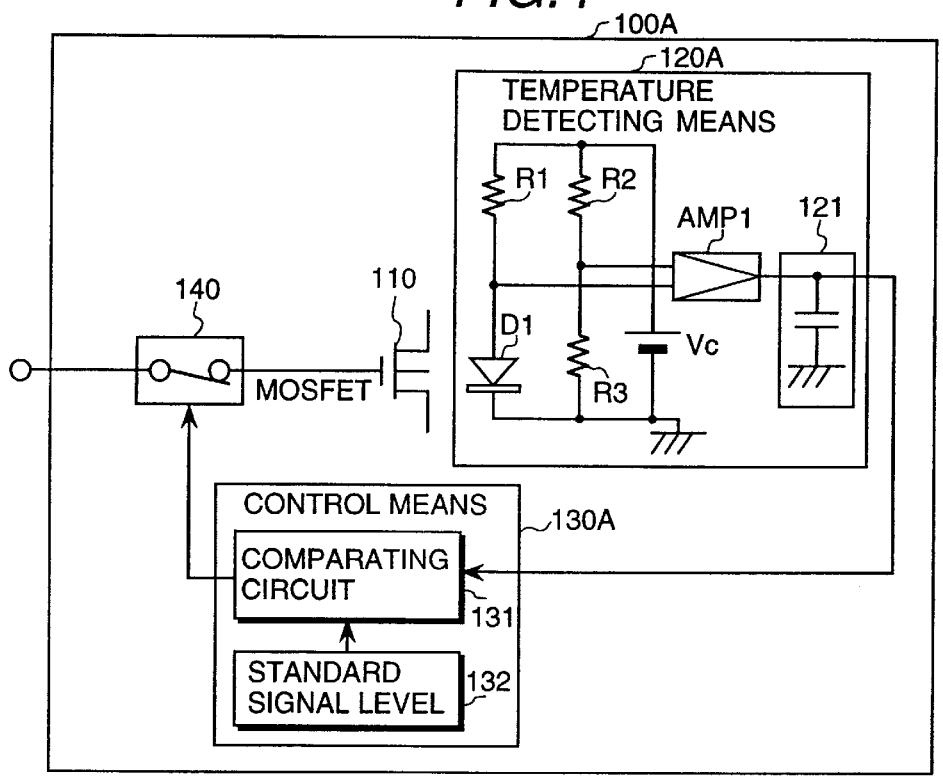
FIG. 4 is a block diagram showing the actual constitution of a temperature detecting means and a control means used in the switch circuit having a protection function of a second embodiment of the present invention.

FIG. 4 is a block diagram showing an actual constitution of a temperature detecting means 120A and a control means 130A used in the switch circuit having protection function, according to a second embodiment of the present invention. Numerals which are the same as those shown in FIG. 3 indicate the same part.

The embodiment shown in FIG. 3 is explained on the assumption that the control means 130 retains the interruption status. However, this embodiment is structured so that the temperature detecting means 120A can retain the maximum value of the detected temperature and the control means 130A can retain the interruption status on the basis of the temperature retained by the temperature detecting means 120A so as to output an interruption signal to the switch 140.

The temperature detecting means 120A comprises a bridge circuit having resistors R1, R2, and R3 and a diode D1, a constant voltage source Vc, a differential amplifier AMP1, and a clamping circuit 121. The diode D1 comprises a PN junction, and is arranged in the neighborhood of the MOSFET 110 on the chip. When the channel of the MOSFET 110 generates heat, the bridge circuit becomes unbalanced, the unbalance of the bridge circuit is amplified by the differential amplifier AMP1, and the temperature detecting means 120A can output a temperature information signal to the control means 130A via the clamping circuit 121. By use of the clamping circuit 121, this embodiment can retain the maximum value of the temperature information signal.

The control means 130A comprises the comparator circuit 131 and the standard signal level circuit 132. The comparator circuit 131 receives the standard signal outputted by the circuit 132 and the temperature information signal outputted by the temperature detecting means 120A; and when the temperature information signal is larger than the standard signal, the comparator circuit 131 outputs an interruption signal on the high level.

As mentioned above, the temperature detecting means 120A is structured to retain the maximum value of detected temperature, so that the electric power element 100 can retain the interruption status. Therefore, when the control means detects that an over-current flows in the load 20 and the temperature of the MOSFET 110 detected by the temperature detecting means 120 is higher than the predetermined interrupting temperature, the control means opens the switch 140, interrupts a signal from the control input terminal CONT from inputting to the MOSFET 110, makes the MOSFET non-conductive, and interrupts power supply to the load 20.

Even if the temperature of the MOSFET 110 falls, after the power supply to the load 20 is interrupted, the control means 130 retains the interruption signal. Therefore, the interruption status is continued and the electric power element 100 does not repeat the unnecessary ON-OFF cycle.

As explained above, according to this embodiment, even if a current surge flows in the load, the electric power element detects the temperature rise caused by an overcurrent flowing in the load. When an error occurs in the load in the absence of a malfunction, due to the current surge, it performs a protection operation for the load; and after power supply to the load is interrupted, the electric power element retains the interruption status and does not repeat the unnecessary ON-OFF cycle.

The overall constitution of a switch circuit having a protection function, according to a third embodiment of the present invention, will be explained by referring to FIG. 5. This embodiment has a reset means 150 in addition to the constitution of the embodiment shown in FIG. 1. The reset means 150 receives a control signal from the control input terminal CONT, and detects (1) a change point where the control signal moves from the continuity level of the MOSFET 110 to the interruption level, (2) a change point where the control signal moves from the interruption level of the MOSFET 110 to the continuity level, or (3) that the control signal is on the interruption level of the MOSFET 110. The detailed constitution of the reset means 150 for detecting the statuses of the respective three configurations will be described later by referring to FIGS. 7 to 9 respectively.

When the reset means 150 detects one of the above conditions, it outputs a reset signal to the control means 130. The control means 130 cancels the control signal interrupting the switch 140 and moves the switch 140 to the continuity (closed) status.

When an over-current flows in the load 20 and the temperature rises, this embodiment interrupts the current supply to the load 20 and retains this interruption status. Therefore, the head lamp is turned off suddenly (or a power window suddenly stops operation, etc.). To locate causes of these operation errors, a driver of the vehicle turns the head lamp switch off (or turns the switch of the power window off) and then turns it on. According to this embodiment, the rest means 150 is provided to recover the interruption status of the switch 140 and allow power supply to the MOSFET 110 for the second ON operation at the moment when such an OFF operation is performed.

Therefore, when the second ON operation is performed thereafter, the lamp lights and the power window also operates. when one of them goes off or stops once again, the driver can detect that the lamp or power window is faulty.

When the control means 130 retains the interruption status like the example shown in FIG. 3, as described above, the reset signal outputted by the reset means 150 is inputted to the control means 130. However, when the temperature detecting means 120A retains the interruption status as explained in FIG. 4, the reset signal outputted by the reset means 150 is inputted to the temperature detecting means 120B. The detailed constitution of the temperature detecting means 120B will be described later by referring to FIG. 10.

Figure 5:
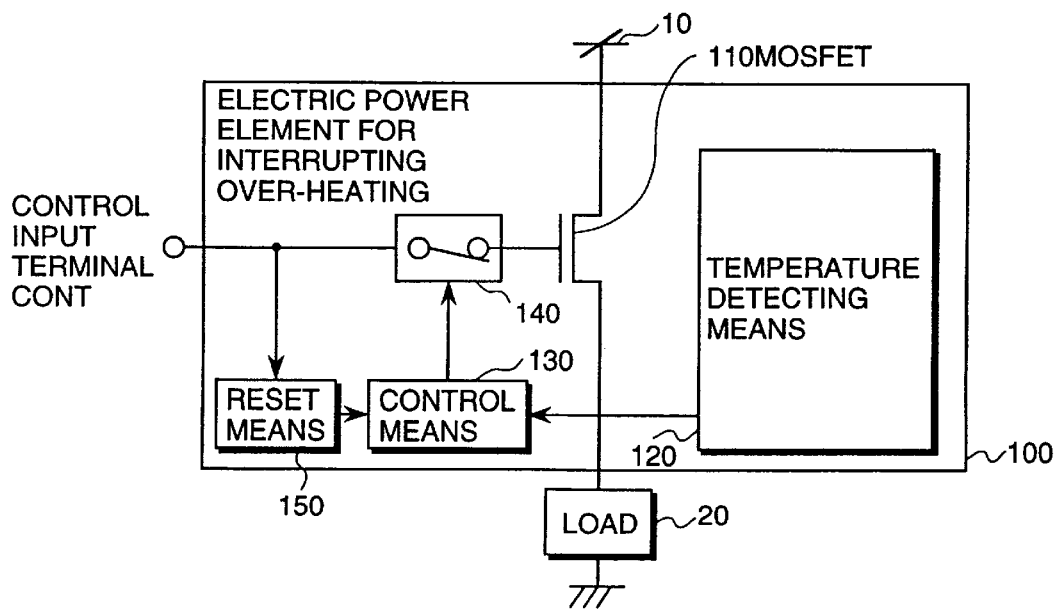
FIG. 5 is a block diagram of the switch circuit having a protection function of a third embodiment of the present invention.
Figure 6:
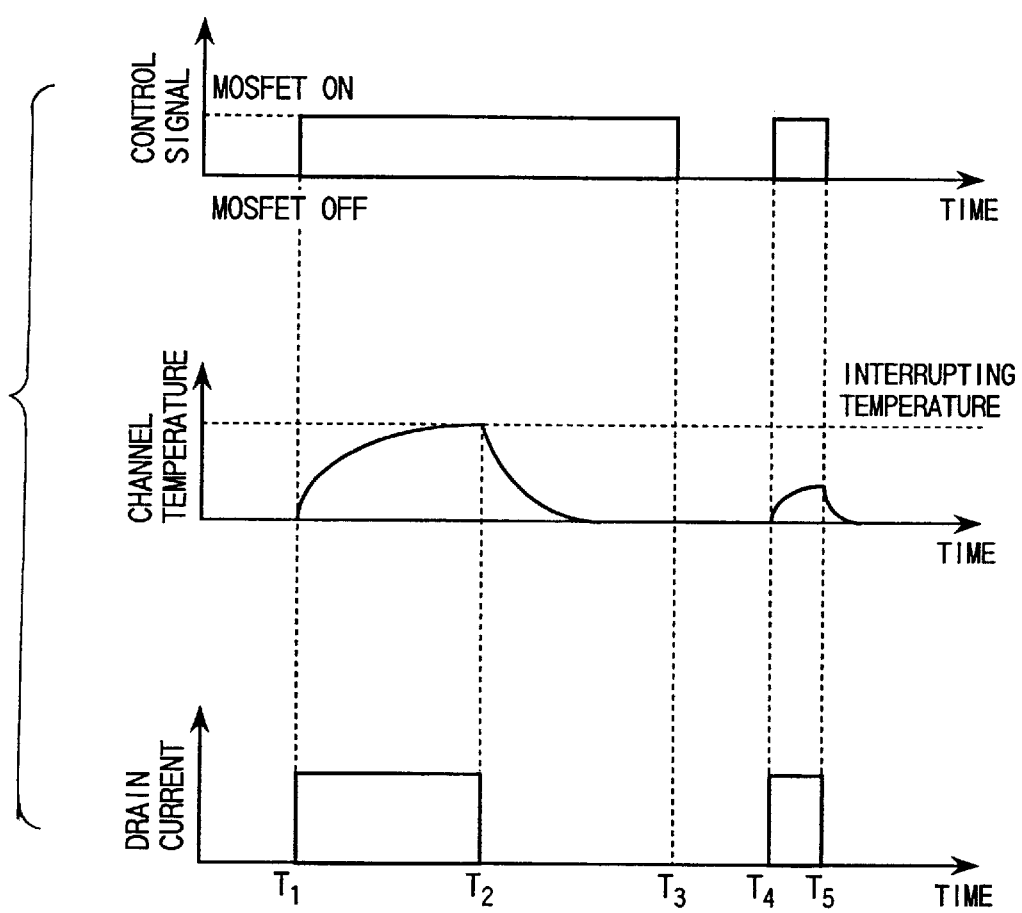
FIG. 6 shows operation waveform diagrams of the switch circuit having protection function of a third embodiment of the present invention.

FIG. 6 is an operation waveform diagram of the switch circuit having a protection function according to the third embodiment of the present invention. FIG. 6 (A) shows a control signal received from the control input terminal CONT shown in FIG. 5; FIG. 6 (B) shows the channel temperature of the MOSFET 110 detected by the temperature detecting means 120; and FIG. 6(C) shows the drain current of the MOSFET 110 flowing in the load 20.

When a control signal as shown in FIG. 6 (A) is inputted from the control input terminal CONT at the time T1, the MOSFET 110 is energized. And, as shown in FIG. 6(C), a current flows in the load 20. Assuming that the load 20 is, for example, a lamp or a motor for a car, when a driver driving the car turns the lighting switch on so as to light the head lamp of the car or operates the switch of the power window, a control signal for energizing the MOSFET 110 is inputted from the control input terminal CONT.

In this case, it is assumed that the load 20 shows a time waveform as shown in FIG. 2 (A), so that a current surge flows when power is turned on, and settles to a steady state current thereafter, like a lamp or a motor. When a rush current as shown in FIG. 2 (A) flows, the temperature rise of the channel of the MOSFET 110 has a waveform as shown in FIG. 2 (B). The rising temperature of the channel due to the current surge is diffused by the heat capacity and thermal conduction of the semiconductor in the neighborhood of the channel and does not show a large peak. on the other hand, when the current is excessive and heat generation of the channel is continued, heat is transferred to the lead frame package and external heat radiation board from the semiconductor chip of MOSFET 20. In this process, the temperature detecting means 120 installed in the neighborhood of the channel detects the temperature in the neighborhood of the channel and outputs a temperature information signal to the control means 130.

In this case, as shown in FIG. 6 (B), the channel generates beat by the channel resistor of the MOSFET 110 and the channel temperature rises. When the current is excessive, the channel temperature slowly rises as shown in FIG. 6 (B) and for example, at the time T2, it is assumed that the channel temperature reaches the predetermined interrupting temperature.

The control means 130 inputting the temperature information signal compares the predetermined interrupting temperature and the inputted temperature information signal. When it judges that the inputted temperature information signal becomes higher than the interrupting temperature, the control means 130 outputs an interruption signal so as to interrupt the switch 140 and cuts off the input signal of the MOSFET 110.

The MOSFET 110 for which the input is cut off is turned off, and the drain current is interrupted as shown in FIG. 6(C), and the current supply to the load 20 is interrupted.

The channel does not generate heat from the time T2, so that the channel temperature lowers slowly to the normal temperature as shown in FIG. 6(B). The control means 130 retains the interruption status of the switch 140.

It is assumed that the control signal inputted to the control input terminal CONT is turned off at the time T3. Namely, when the driver driving the car turns the lighting switch of the head lamp of the car off or turns the switch of the power window off, the control signal is turned off. Even if the control signal is turned off, the MOSFET 110 performs no operation and the drain current of the MOSFET 110 is not changed.

Assuming that the reset means 150, for example, detects a change point where the control signal applied to the control input terminal CONT moves from the continuity level of the MOSFET 110 to the interruption level, the reset means 150 outputs the reset signal to the control means 130 at the time T3. The control means 130 cancels the control signal interrupting the switch 140 and allows the switch 140 to move to the continuity status. By doing this, the control means 130 moves the input of the MOSFET 110 from the interruption status to the continuity status and resets it.

When a new control signal is inputted at the time T4 thereafter, the MOSFET 110 is energized because the switch 140 is in the continuity status. The drain current flows and the channel temperature rises.

When the control signal is turned off at the time T5, the drain current does not flow and the channel temperature lowers.

Figure 7:
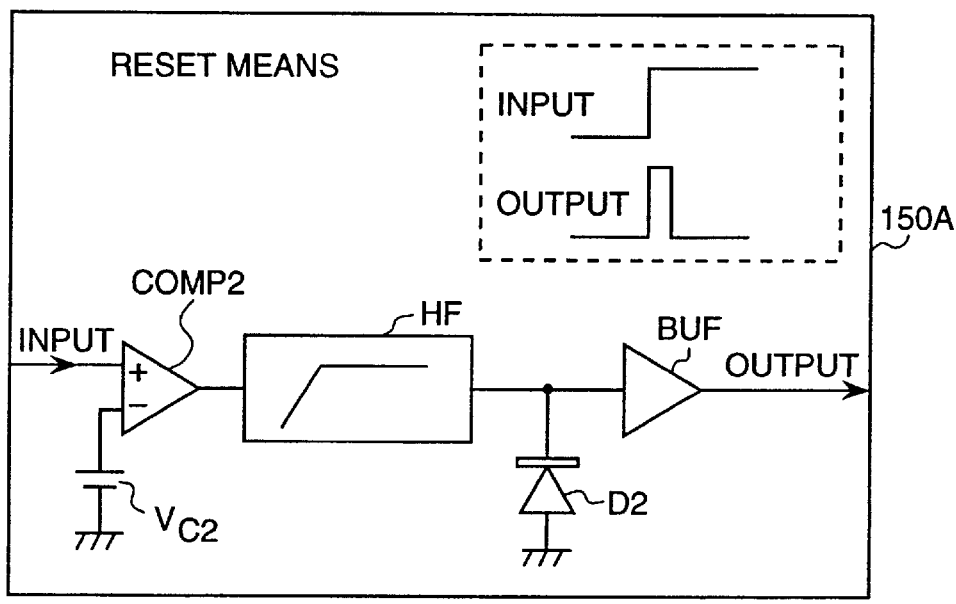
FIG. 7 is a circuit diagram of a first example of the reset means in the switch circuit having a protection function of a third embodiment of the present invention.

FIG. 7 is a circuit diagram of a first example of the reset means in the protected switch circuit according to the third embodiment of the present invention.

In this embodiment, the reset means 150 detects a change point where the control signal inputted from the control input terminal CONT moves from the continuity level of the MOSFET 110 to the interruption level. The first example will be explained hereunder on the assumption that the interruption level is higher than the continuity level. However, the reverse relation may be acceptable.

The reset means 150 comprises a comparator COMP1, a standard power source Vc2, a high-pass filter HF, a diode D2, and a waveform shaping buffer BUF.

The control signal inputted from the control input terminal CONT is inputted to the positive input terminal of the comparator COMP1. To the inverse input terminal of the comparator COMP1, the standard potential from the standard power source Vc2 is inputted. The standard potential is set in the neighborhood of the middle point between the continuity level and the interruption level of the control signal. The comparator COMP1 compares the control signal and the standard potential, and when the control signal becomes higher than the standard potential, the comparator COMP1 generates an output signal rising suddenly.

The output signal of the comparator COMP1 is inputted to the high-pass filter HF, and the DC component is cut, and only the high frequency component passes. Furthermore, the unnecessary negative component is cut by the diode D2. The waveform is shaped by the waveform shaping buffer BUF and a reset signal which is a pulse-shaped output can be obtained. The reset signal is inputted to the control means 130 or the temperature detecting means 120B.

Figure 8:
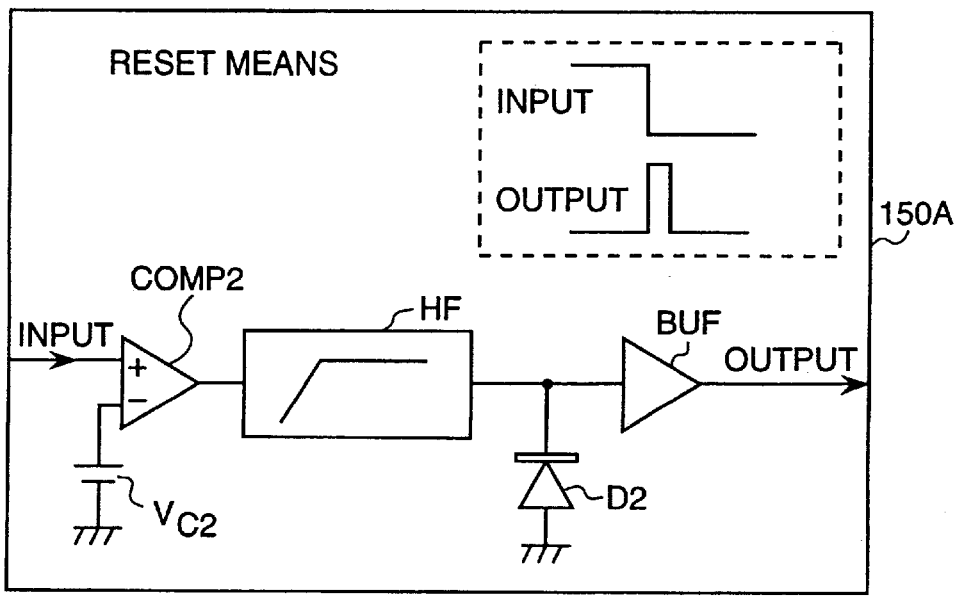
FIG. 8 is a circuit diagram of a second example of the reset means in the switch circuit having a protection function of a third embodiment of the present invention.

Next, a second example of the reset means 150 will be explained by referring to the circuit diagram of FIG. 8.

In this embodiment, the reset means 150A detects a change point where the control signal inputted from the control input terminal CONT moves from the interruption level of the MOSFET 110 to the continuity level. The second example will be explained on the assumption that the interruption level is higher than the continuity level. However, the reverse relation may be acceptable.

The reset means 150 comprises a comparator COMP2, a standard power source Vc2, a high-pass filter HF, a diode D2, and a waveform shaping buffer BUF.

The control signal inputted from the control input terminal CONT is inputted to the inverse input terminal of the comparator COMP2. To the positive input terminal of the comparator COMP1, the standard potential from the standard power source Vc2 is inputted. The standard potential is set in the neighborhood of the middle point between the continuity level and the interruption level of the control signal. The comparator COMP2 compares the control signal and the standard potential and when the control signal becomes lower than the standard potential, the comparator COMP2 generates an output signal rising suddenly.

The output signal of the comparator COMP2 is inputted to the high-pass filter HF, and the DC component is cut, and only the high frequency component passes. Furthermore, the unnecessary negative component is cut by the diode D2. The waveform is shaped by the waveform shaping buffer BUF and a reset signal which is a pulse-shaped output can be obtained. The reset signal is inputted to the control means 130 or the temperature detecting means 120B.

Figure 9:
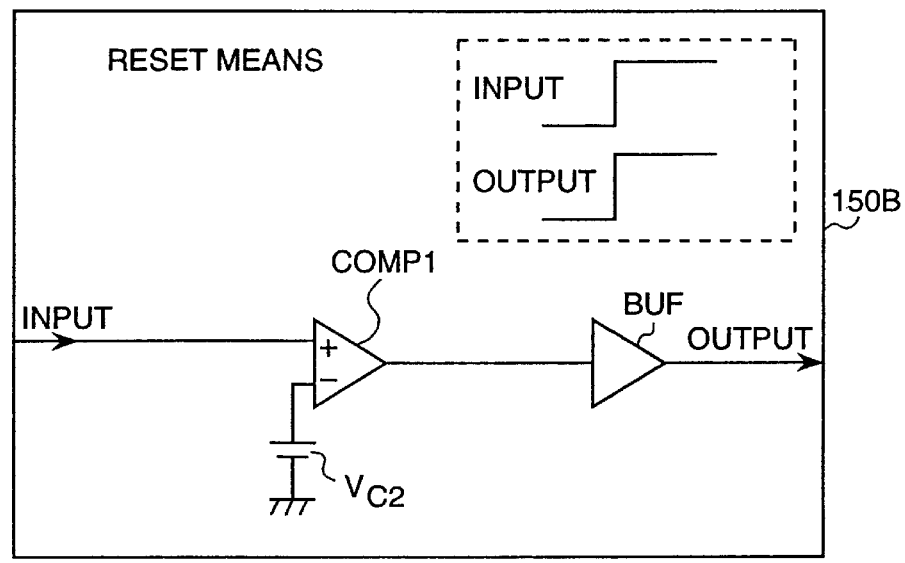
FIG. 9 is a circuit diagram of a third example of the reset means in the switch circuit having a protection function of a third embodiment of the present invention.

Next, a third example of the reset means 150 will be explained by referring to the circuit diagram of FIG. 9.

In this embodiment, the reset means 150B detects that the control signal inputted from the control input terminal CONT is on the interruption level of the MOSFET 110. The third example will be explained hereunder on the assumption that the interruption level is higher than the continuity level. However, the reverse relation may be acceptable.

The reset means 150B comprises a comparator COMP1, a standard power source Vc2, and a waveform shaping buffer BUF.

The control signal from the control input terminal CONT is inputted to the positive input terminal of the comparator COMP1. To the inverse input terminal of the comparator COMP1, the standard potential from the standard power source Vc2 is inputted. The standard potential is set in the neighborhood of the middle point between the continuity level and the interruption level of the control signal. The comparator COMP1 compares the control signal and the standard potential and when the control signal becomes higher than the standard potential, the comparator COMP1 generates an output signal rising suddenly.

The output signal of the comparator COMP1 is shaped in waveform by the waveform shaping buffer BUF and a reset signal which is an output changing in a step shape can be obtained. The reset signal is inputted to the control means 130 or the temperature detecting means 120B.

Next, the constitution of the control means 130 which is reset by the reset signal outputted by the reset means 150 will be explained.

When the interruption status is retained by the control means 130 as shown in FIG. 3. the reset signal is inputted to the control means 130. As explained in FIG. 3, in the constitution of the control means 130, the latch circuit 133 of the control means 130 has a reset terminal. When a signal is inputted to this reset terminal, the content latched in the latch circuit 133 can be reset. Therefore, when the reset signal outputted by the reset means 150 is inputted from the reset terminal of the latch circuit 133, the interruption status retained by the control means 130 can be canceled.

Figure 10:
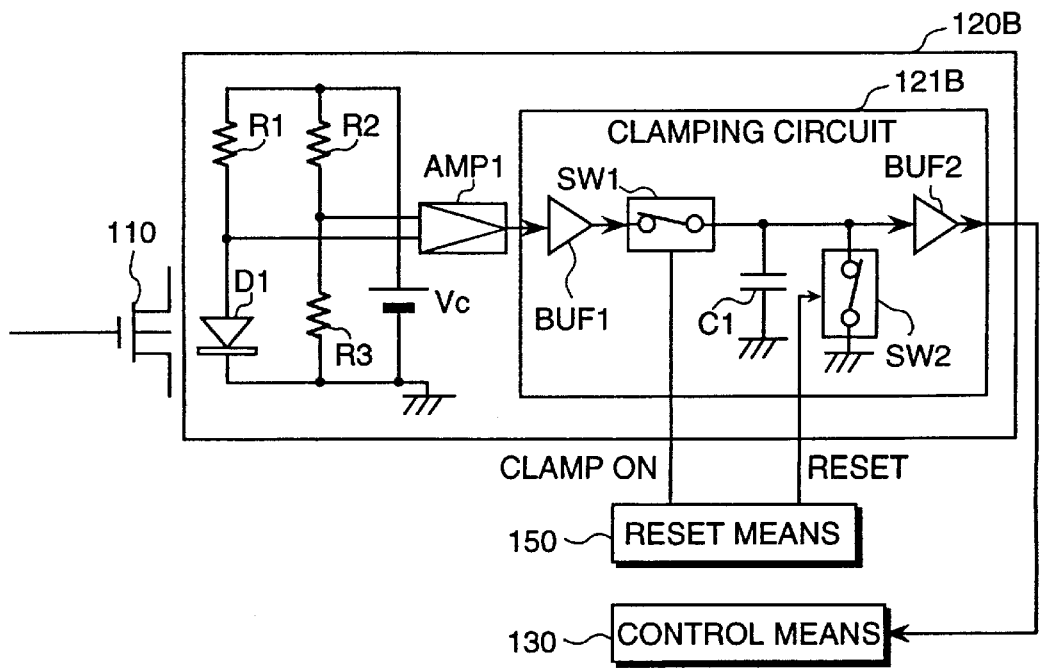
FIG. 10 is a circuit diagram of the temperature detecting means in the switch circuit having a protection function of a third embodiment of the present invention.

FIG. 10 is a circuit diagram of the temperature detecting means 120B in the switch circuit having a protection function according to the third embodiment of the present invention.

When the interruption status is retained by the temperature detecting means as shown in FIG. 4, the reset signal is inputted to the temperature detecting means 120B. As shown in FIG. 10, in addition to the constitution shown in FIG. 4, the clamping circuit 121B has a switch SW1 and a switch SW2. (Each reference numeral which is the same as that shown in FIG. 4 indicates the same part.

The SW1 is connected between the output of the buffer BUF1 and the capacitor C1. The SW2 is connected in parallel with the capacitor C1. When the reset signal from the reset means 150 is inputted to the switch SW2, the switch SW2 is energized and the maximum value of temperature information charged in the capacitor C1 is discharged via the switch SW2. By doing this, the temperature information retained in the capacitor C1 is reset and the interruption status retained by the temperature detecting means 120B can be canceled.

When a clamp ON signal is inputted to the switch SW1 after the temperature information is reset by the reset signal, the clamping circuit 121B can retain the maximum value of new temperature information. The clamp ON signal can be generated, for example, on the basis of the reset signal. Namely, the multi-vibrator is operated by the preset signal and a step-shaped signal outputted by the multi-vibrator can be set as a clamp ON signal.

As explained above, according to this embodiment, even if a current surge flows in the load, the overheating protected electric power (switch) element detects a temperature rise caused by an overcurrent flowing in the load when an error occurs in the load without malfunction, due to the current surge, and performs a protection operation for the load. After power supply to the load is interrupted, the electric power element retains the interruption status and does not repeat the unnecessary ON-OFF cycle.

Since the interruption status can be canceled using the reset means, for input of a second control signal on the continuity level, the switch circuit can be energized and power supply to the load can be restarted. When an overcurrent flows in the load, the power supply to the load is interrupted once again and the interruption status can be retained.

Next, the overall constitution of a switch circuit having protection function according to a fourth embodiment of the present invention will be explained by referring to FIG. 11.

Figure 11:
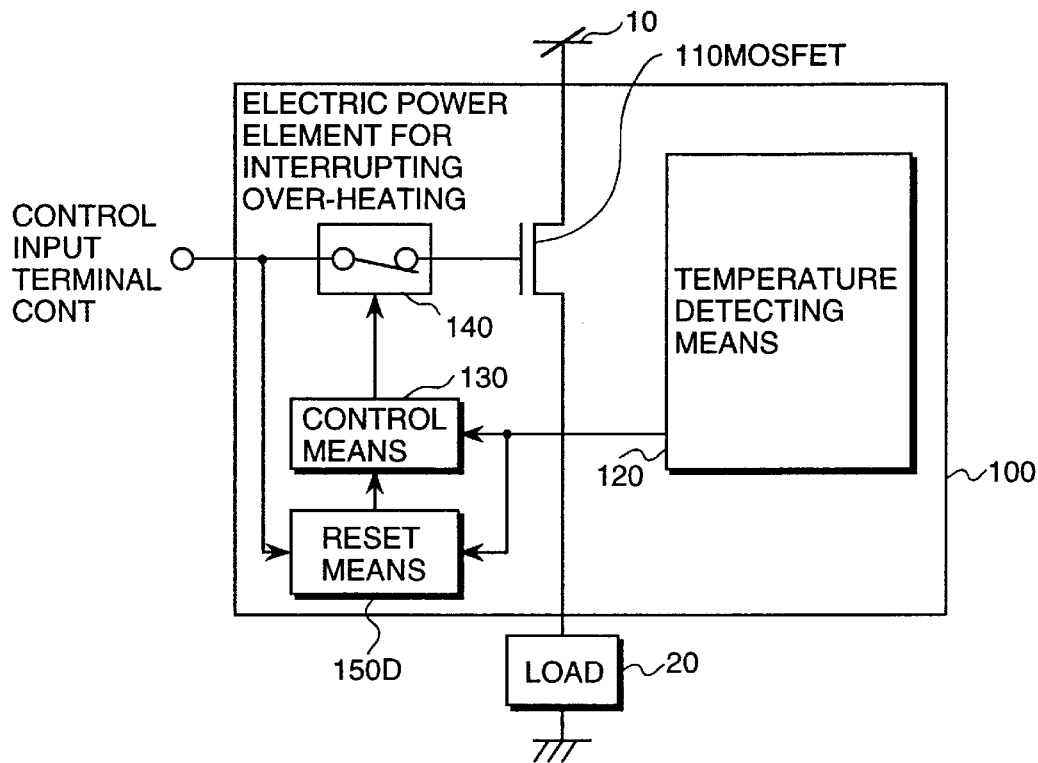
FIG. 11 is a block diagram of the switch circuit having a protection function of a fourth embodiment of the present invention.

FIG. 11 is a block diagram of the protected switch circuit of the fourth embodiment of the present invention. Each reference numeral which is the same as that shown in FIG. 5 indicates the same part.

According to this embodiment, in addition to the constitution of the embodiment shown in FIG. 5, a reset means 150D outputs a reset signal on the basis of the temperature information from the temperature detecting means 120. Namely, when the temperature detected by the temperature detecting means 120 is higher than the predetermined interruption canceling temperature, the reset means 150D will not output a reset signal. The interruption canceling temperature is a temperature lower than the interrupting temperature at which the switch 140 enters the interruption status. When the interrupting temperature is set at, for example, 150° C., the interruption canceling temperature is set to, for example, 125° C.

Figure 12:
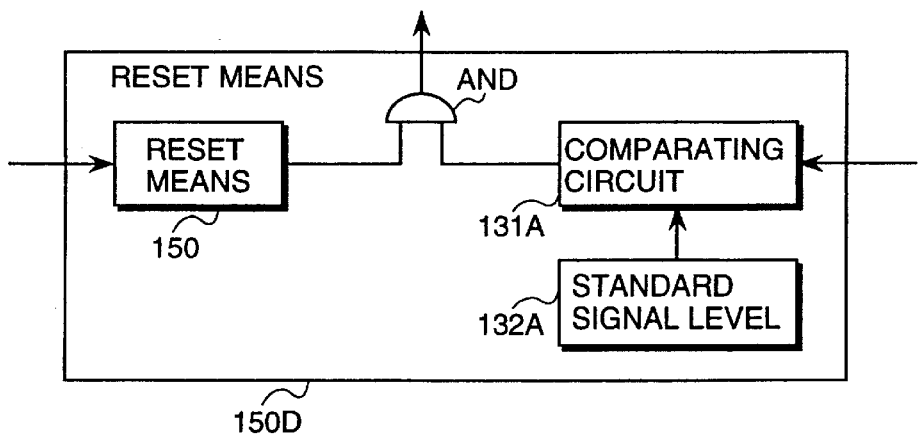
FIG. 12 is a circuit diagram of the reset means in the switch circuit having a protection function of a fourth embodiment of the present invention.

FIG. 12 is a circuit diagram of the reset means 150D in the protected switch circuit of the fourth embodiment of the present invention.

The reset means 150D comprises the reset means 150 explained in FIG. 7, a comparator circuit 131A, a standard signal level circuit 132A, and an AND circuit AND. The temperature information signal inputted from the temperature detecting means 120 is inputted to the comparator circuit 131A. The standard signal level circuit 132A outputs a standard signal equivalent to an interruption canceling temperature (lower than the interrupting temperature at which the electric power element 100 performs the protection operation to the comparator circuit 131A). The comparator circuit 131A receives the standard signal outputted by the standard signal level circuit 132A and the temperature information signal outputted by the temperature detecting means 120 and when the temperature information signal is larger than the standard signal, the comparator circuit 131A outputs an interruption signal on the high level.

The output signal of the comparator circuit 131A and the reset signal outputted by the reset means 150 are inputted to the AND circuit AND. Namely, when the temperature detected by the temperature detecting means 120 is higher than the predetermined interruption canceling temperature, the reset means 150D will not output a reset signal.

Next, the operation of the overheating protected electric power element 100D shown in FIG. 11 will be explained by referring to the waveform diagrams of FIG. 13.

FIG. 13(A) shows a control signal inputted via the control input terminal CONT shown in FIG. 11; FIG. 13(B) shows the channel temperature of the MOSFET 110 detected by the temperature detecting means 120; and FIG. 6 (C) shows a drain current of the MOSFET 110 flowing in the load 20.

Figure 13:
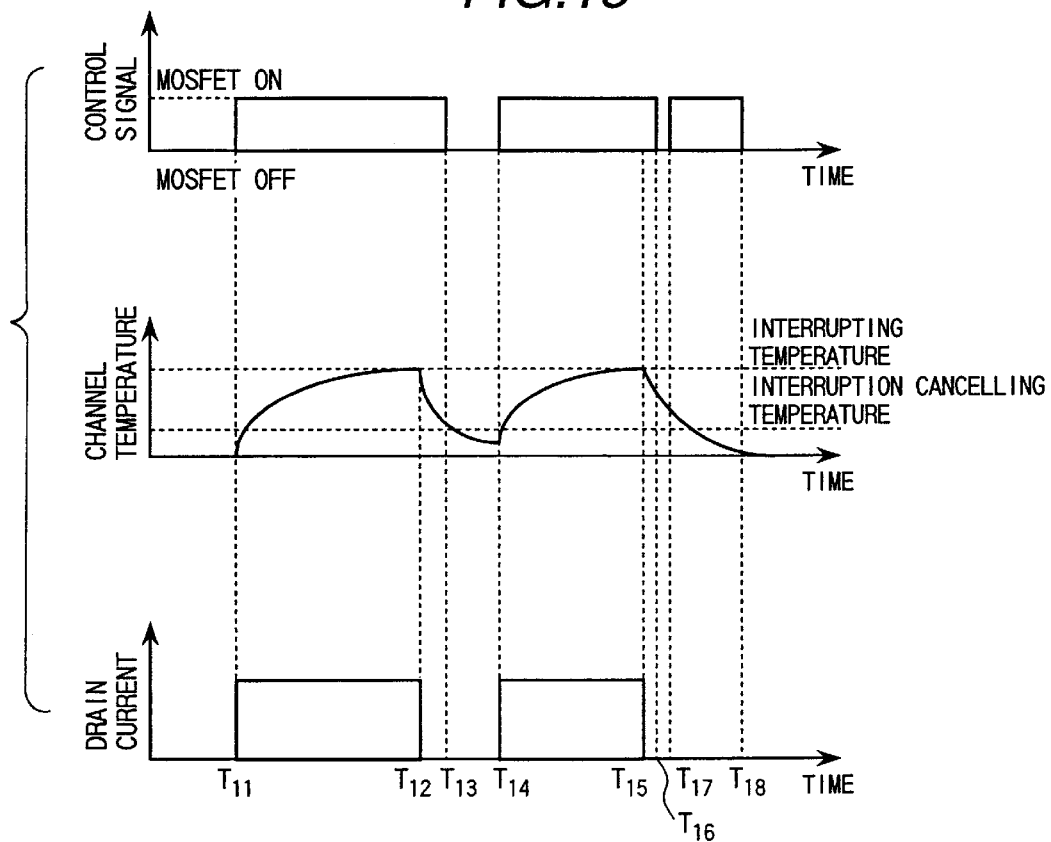
FIG. 13 shows waveform diagrams for explaining the operation of the switch circuit having a protection function of a fourth embodiment of the present invention.

When a control signal as shown in FIG. 13 (A) is inputted via the control input terminal CONT at the time T11, the MOSFET 110 is energized. And, as shown in FIG. 13 (C), a current flows in the load 20. As shown in FIG. 13 (B), the temperature detecting means 120 installed in the neighborhood of the channel of the MOSFET 110 detects the temperature in the neighborhood of the channel and outputs a temperature information signal to the control means 130.

Assuming that the channel temperature reaches the predetermined interrupting temperature at the time T12, the control means 130 compares the predetermined interrupting temperature and the inputted temperature information signal. When the inputted temperature information signal becomes higher than the interrupting temperature, the control means 130 outputs an interruption signal so as to interrupt the switch 140 and cuts off the input signal of the MOSFET 110. The MOSFET 110 for which the input is cut off is turned off; the drain current is interrupted as shown in FIG. 13(C); and the current supply to the load 20 is interrupted. The channel does not generate heat from the time T12, so that the channel temperature falls slowly to the normal temperature as shown in FIG. 13(B). The control means 130 retains the interruption status of the switch 140.

It is assumed that the control signal inputted to the control input terminal CONT is turned off at the time T13. Even if the control signal is turned off, the MOSFET 110 performs no operation and the drain current of the MOSFET 110 is not changed.

When a new control signal is inputted at the time T14 thereafter, the MOSFET 110 is energized because the switch 140 is in the continuity status The drain current flows and the channel temperature rises.

When the channel temperature reaches the interrupting temperature once again at the time T15, the control means 130 judges the temperature detected by the temperature detecting means 120 as the interrupting temperature and interrupts the switch 140. When the switch 140 is interrupted, the MOSFET 110 enters the OFF status and the drain current is interrupted. The channel does not generate heat from the time T15 in the same way thereafter, so that the channel temperature lowers slowly to the normal temperature as shown in FIG. 13(B).

Even if the control signal to the control input terminal CONT is turned off at the time T16, the MOSFET 110 performs no operation.

When a new control signal as shown in FIG. 13(A) is inputted at the time T17, the reset means 150D detects, for example, a change point where the control signal moves from the continuity level of the MOSFET 110 to the interruption level. At the same time with detection of them, the reset means 150D fetches the temperature information detected by the temperature detecting. means 120. However, since the temperature information detected by the temperature detecting means 120 is higher than the interruption canceling temperature at the time T17, the control means 130 controls the switch 140 in the interruption status.

As explained above, according to this embodiment, if a current surge flows in the load, the overheating protected electric power element detects a temperature rise caused by an overcurrent flowing in the load when an error occurs in the load without a malfunction, due to the current surge and performs a protection operation for the load and after power supply to the load is interrupted, the electric power element retains the interruption status and does not repeat the unnecessary ON-OFF cycle.

Since the interruption status can be canceled using the reset means, for input of a second control signal on the continuity level, the switch circuit can be energized and power supply to the load can be restarted. When an overcurrent flows in the load, the power supply to the load is interrupted once again and the interruption status can be retained.

Furthermore, the reset means outputs no reset signal unless the temperature detected by the temperature detecting means becomes lower than the interruption canceling temperature. Therefore, for repetition of the operation for turning a lamp ON or OFF or frequent repetition of running or stopping of a motor, the reset means retains the interruption status, and the load can be prevented from an unnecessary over-current.

Next, the overall constitution of a protected switch circuit according to a fifth embodiment of the present invention will be explained by referring to FIG. 14. Each reference numeral which is the same as that shown in FIG. 5 indicates the same part.

According to this embodiment, in addition to the overheating protected electric power element 100B shown in FIG. 5, an input controller 200 is provided between the control input terminal CONT and the electric power element 100B.

The embodiment shown in FIG. 5 is explained using an example that the channel is overheated by an overcurrent and the switch circuit is interrupted. However, the load is driven by the steady state current and when the channel temperature does not rise up to the interrupting temperature, it may be considered that the load is instantaneously short-circuited or a load having a large current is instantaneously connected and the switch circuit is interrupted due to overheating.

In this case, in the embodiment shown in FIG. 5, output of the MOSFET 110 is not carried out until the control signal inputted to the control input terminal is turned off once as shown in FIG. 6. Also in the embodiment shown in FIG. 11, input of the MOSFET 110 between T12 and T13 is kept interrupted. When the load is permanently short-circuited, this operation may be acceptable. However, when the load is instantaneously short-circuited or a load having a large current is instantaneously connected as mentioned above, there is a case requiring return.

Therefore, in this embodiment, the input controller 200 superposes a signal on the interruption level on the control signal inputted from the control input terminal CONT in the predetermined timing. The overheating protected electric power element 100B receiving the signal on the interruption level operates to cancel the interruption status by operation of the reset means 150 even if the load is instantaneously short-circuited or a load having a large current is instantaneously connected.

Figure 14:
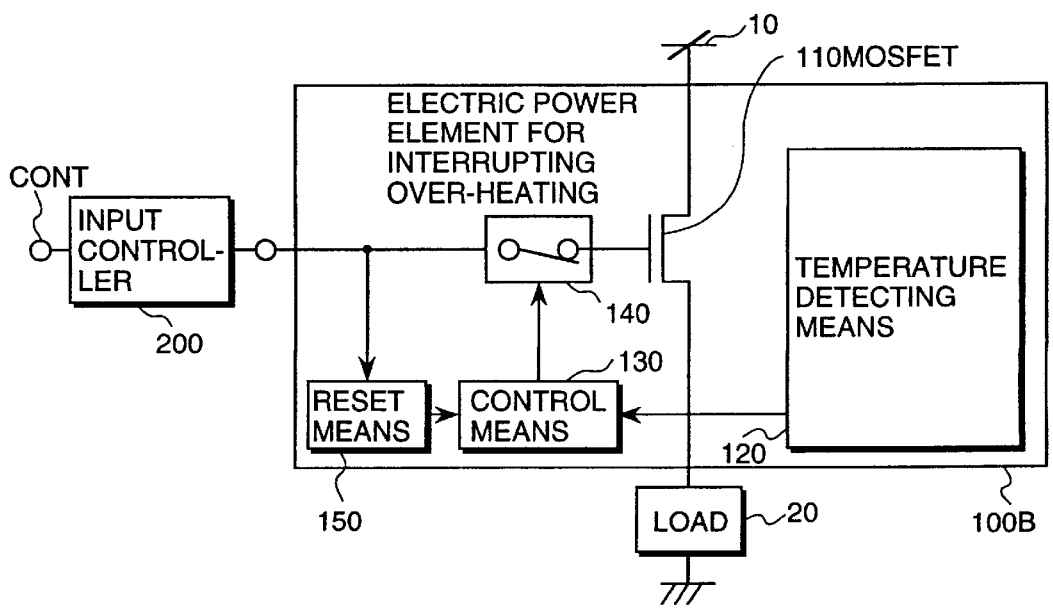
FIG. 14 is a block diagram of the switch circuit having a protection function of a fifth embodiment of the present invention.
Figure 15:
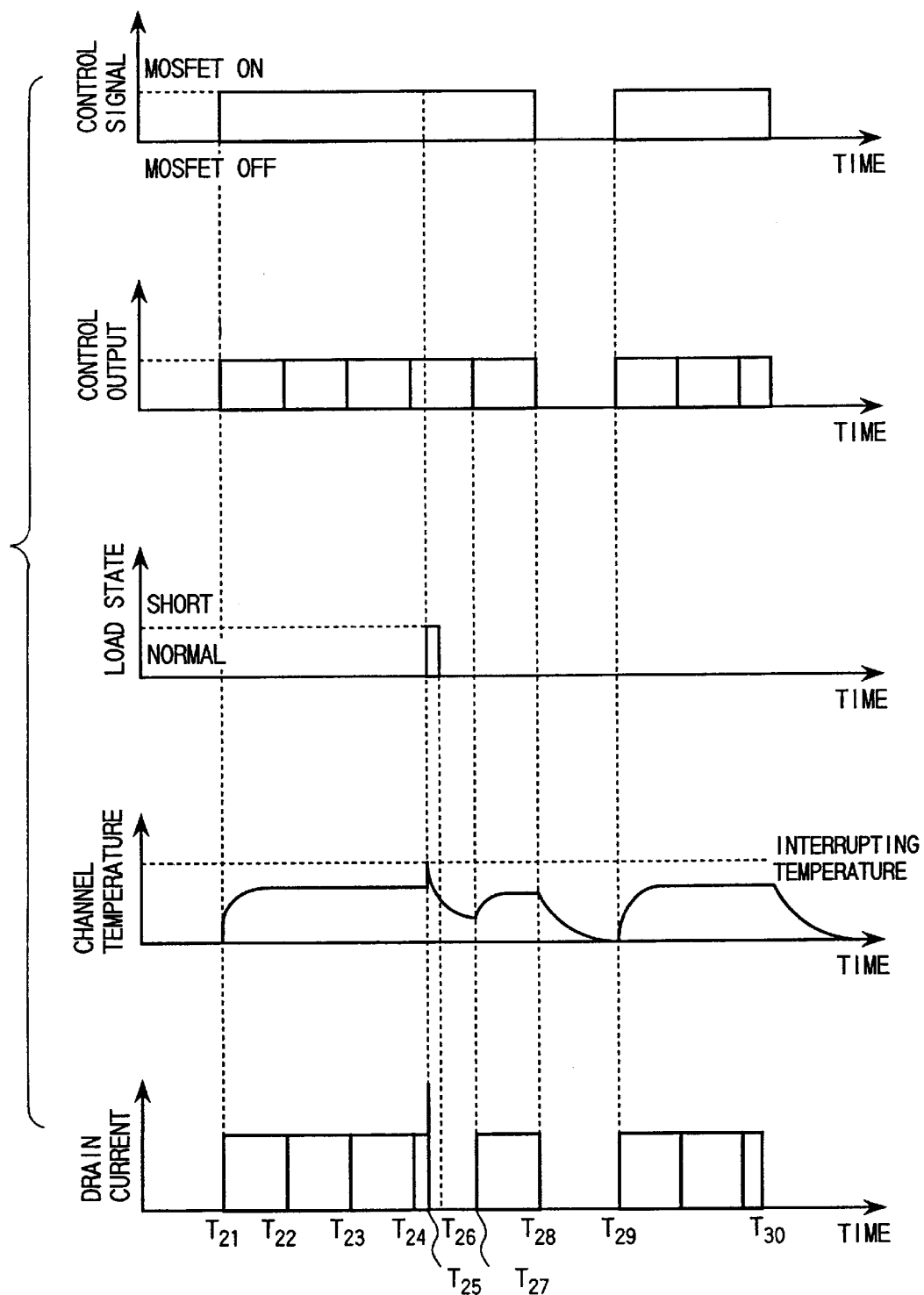
FIG. 15 shows waveform diagrams for explaining the operation of the switch circuit having a protection function of a fifth embodiment of the present invention.

FIG. 15 shows waveform diagrams for explaining the operation of the protected switch circuit 100B according to a fifth embodiment of the present invention. FIG. 15(A) shows a control signal inputted via the control input terminal CONT shown in FIG. 14; FIG. 15(B) shows an output signal of the input controller 200; FIG. 15(C) shows the status of the load; FIG. 15(D) shows the channel temperature of the MOSFET 110 detected by the temperature detecting means 120; and FIG. 15(E) shows a drain current of the MOSFET 110 flowing in the load 20. Details of FIG. 15(B) will be described later by referring to FIG. 16.

In the embodiment shown in FIG. 14, it is assumed that the control signal inputted to the control input terminal CONT has a signal waveform as shown in FIG. 15(A). Namely, between the time T21 and T28 and between the time T29 and T30, the control signal is at a level for causing the MOSFET 110 to be conductive.

This control signal is converted to a signal having the waveform as shown in FIG. 15(B) by the input controller 200. Each bold vertical line shown at the time T22, T23, T24, T27, etc. indicates a signal for interrupting conduction in the MOSFET 110 only for a short time at each time.

Figure 16:
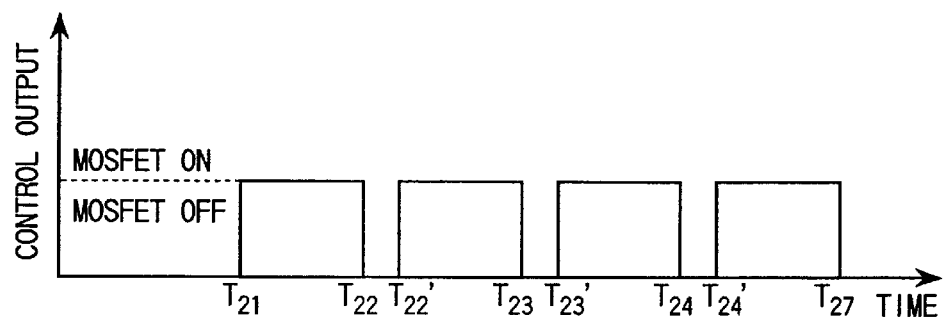
FIG. 16 shows a waveform diagram for explaining the operation of the input controller 200 in the switch circuit having a protection function of a fifth embodiment of the present invention.

FIG. 16 is a waveform diagram for explaining the operation of the input controller 200 in the protected switch circuit according to the fifth embodiment of the present invention. When the period from the time T21 (shown in FIG. 15 when the MOSFET 110 is turned on) to the time T28 is increased, as shown in FIG. 16, during the period when the MOSFET 110 is on, the control signal to be inputted is modified by inserting a signal which is off for a short time (such as the term from the time T22 to T22', the term from the time T23 to the time T23', and the term from the time 24 to T24').

When the control signal is inputted to the control input terminal CONT as shown in FIG. 15(A), the MOSFET 110 is turned on at the time T21 and the drain current flows and a current is supplied to the load as shown in FIG. 15(E).

The output signal of the input controller 200 becomes an off signal at the time T22 shown in FIG. 15 and becomes an on signal after lapse of a short time. During this term, the reset means 150 outputs the reset signal to the control means 130. However, the control means 130 does not operate particularly because the switch 140 is energized.

On the other hand, when the off time is shorter than a certain value, the MOSFET 110 is kept on because the charge stored in the gate is kept stored. Even if the charge is discharged by the input impedance of the MOSFET 110 and the MOSFET 110 is turned off, if the off time is short and a lamp emitting infrared light energy of the filament or a motor having inertia is a load, the operation performed by the load will be affected only slightly. The same operation is performed at the time T23 and time T24 shown in FIG. 15.

Next, it is assumed that as shown in FIG. 15(C), the load is short-circuited at the time T25 and the short-circuit of the load is canceled at the time T26 after lapse of a short time.

The channel temperature of the MOSFET 110 rises from the normal temperature up to the temperature which is thermally balanced from a starting point of the time T21 as shown in FIG. 15(D) and keeps a constant value. However, since the load is short-circuited at the time T25, as shown in FIG. 15(E), the drain current increases and the heat generated by the channel suddenly increases. Although there is a time delay between the time T25 and thermal conduction, it is judged that the temperature detected by the temperature detecting circuit 120 becomes the temperature interrupted by the control circuit 130 and the switch 140 is controlled so as to move from the continuity status to the interruption status. As a result, the MOSFET 110 is turned off and the drain current is turned off as shown in FIG. 15(E). When the MOSFET 110 is turned off, the channel temperature begins to lower to the normal temperature at the same time.

There is a term during which the control signal is turned off at the time T27, so that the reset means 150 outputs an interruption canceling signal to the control means 130. The control means 130 receiving the interruption canceling signal keeps the switch 140 in the interruption status when the temperature detected by the temperature detecting means 120 is higher than the interrupting temperature and controls the switch 140 so as to move from the interruption status to the continuity status when it is lower. in the example shown in FIG. 15, as shown in FIG. 15(C), the channel temperature is lower than the interruption temperature. Therefore, the control means 130 controls the switch 140 so as to move from the interruption status to the continuity status. At this point of time, as shown in FIGS. 15(A) and (B), the control signal turning on is inputted, so that the MOSFET 110 is turned on and the drain current flows as shown in FIG. 15(E) and is supplied to the load.

As explained above, even it the load is instantaneously short-circuited or a load having a large current is instantaneously connected, the reset means 150 operates so as to cancel the interruption status. Furthermore, control for turning off once and then resetting after a certain time is made possible.

Next, an actual circuit constitution of the input circuit 200 will be explained by referring to FIG. 17, which is a block diagram of a first example of the input controller in the protected switch circuit according to the fifth embodiment of the present invention.

The input controller 200 comprises change-over switches 210 and 215, a signal inverting means 220, and a change-over signal generating means 230. The change-over signal generating means 230 comprises a counter circuit 232 and a change-over control means 234.

Next, the operation of the input controller 200 will be explained by additionally referring to the waveform diagram shown in FIG. 16.

It is assumed that a signal on the continuity level of the MOSFET 110 is inputted to the control input terminal CONT of the input controller 200 at the time T21 shown in FIG. 16 and becomes a signal on the interruption level at the time T27.

Before the signal on the continuity level of the MOSFET 110 of the control input terminal CONT is inputted preceding time T21, the change-over control means 234 changes both the switches 210 and 215 to the A side. Then, at the time T21, the signal of the control input terminal CONT becomes a signal on the continuity level of the MOSFET 110 as shown at the time T21 in FIG. 16.

This control signal is inputted to the counter circuit 232 at the same time. The detailed constitution of the counter circuit 232 will be explained later by referring to FIG. 18. The counter circuit 232 receiving the control signal starts to reset and count the counter circuit. When the counter circuit 232 counts the first predetermined value, it outputs the first output to the change-over control means 234, at time T22 shown in FIG. 16.

When the change-over control means 234 receives the first output from the counter circuit 232, it outputs a change-over signal to the switches 210 and 215 and changes the switches to the B side. Therefore, the signal of the control input terminal CONT is inverted by the inverting means 220 via the switch 210 and outputted via the switch 215. As a result, the signal assumes a level which interrupts the MOSFET 110 as shown at the time T22 in FIG. 16.

The counter circuit 232 outputting the first output starts counting again, and when the counter circuit 232 counts only the second predetermined value, it outputs the second output to the change-over control means 234. When the change-over control means 234 receives the second output, it outputs a changeover signal to the switches 210 and 215 and changes the switches to the A side. The control signal inputted to the control input terminal CONT is outputted via the switch 215 directly connected to the switch 210, so that a signal on a level energizing the MOSFET 110 is outputted as shown at the time T22' in FIG. 16.

The counter circuit 232 outputting the second output starts counting again and when the counter circuit 232 counts only the first count value, it outputs the first output to the change-over control means 234. The counter circuit 232 repeats output sequentially at the interval between the first count value and the second count value like this and a desired signal as shown in FIG. 16 can be obtained.

This embodiment is explained on the assumption that the change-over signal generating means 230 comprises the counter circuit 232 and the change-over control means 234. However, it is possible to use a control means such as a microcomputer for the changeover control means 230 and control the change-over timing of the switches 210 and 215 by using software.

Figure 18:
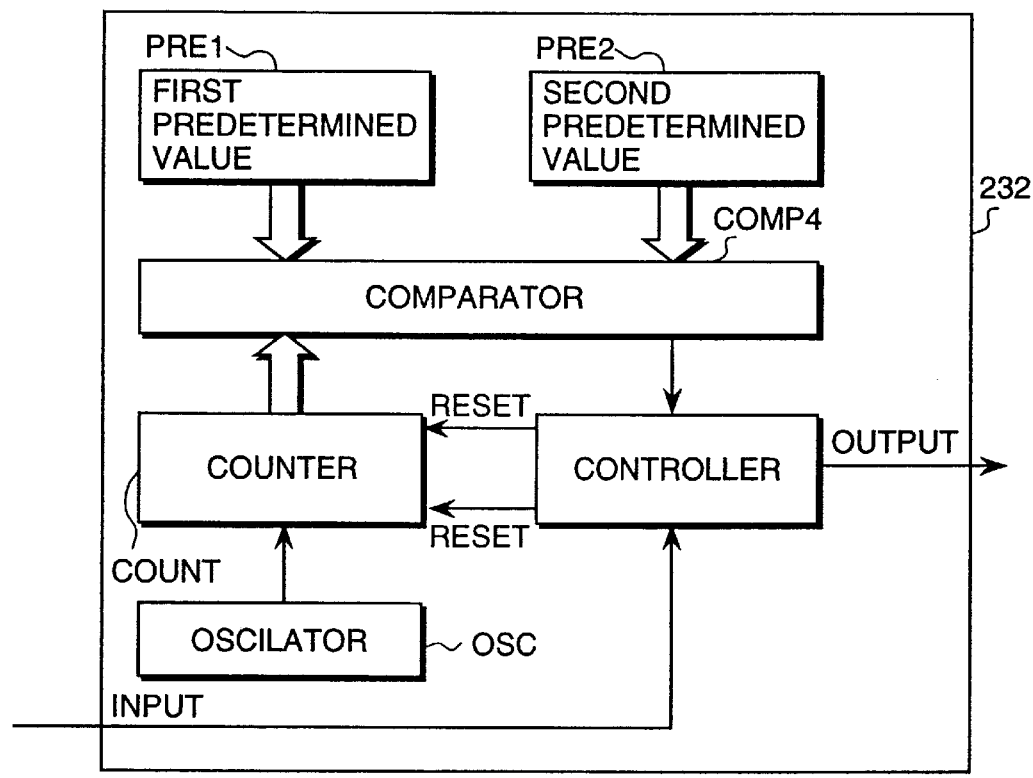
FIG. 18 is a block diagram of the counter circuit in the input controller in the switch circuit having a protection function of a fifth embodiment of the present invention.

FIG. 18 is a block diagram of the counter circuit 232 in the input controller in the protected switch circuit according to a fifth embodiment of the present invention.

The counter circuit 232 comprises a counter COUNT, a controller CONTR, a digital type comparator COMP4, a preset circuit PRE1 for outputting the first predetermined value, a preset circuit PRE2 for outputting the second predetermined value, and a standard oscillator OSC.

The controller CONTR has two input signals and three output signals. The input signals are a control signal obtained from the control input terminal CONT for starting or stopping the counter COUNT and a coincidence signal from the comparator COMP4. The output signals are a start signal for instructing count start of the counter COUNT, a reset signal for resetting the counter COUNT, and an output signal which is an output of the counter circuit 232.

When the control signal is inputted from the control input terminal CONT, the controller CONTR outputs a start signal to the counter COUNT. The counter COUNT receives this start signal and starts to count pulses outputted from the standard oscillator OSC. The count value of the counter COUNT is inputted to the comparator COMP4 and compared with the first predetermined value outputted by the preset circuit PREi first and when the two coincide with each other, the comparator COMP4 outputs a coincidence signal to the controller CONTR. The controller CONTR receives this coincidence signal and outputs an output signal to the change-over control means 232 and outputs a reset signal to the counter COUNT at the same time.

Figure 17:
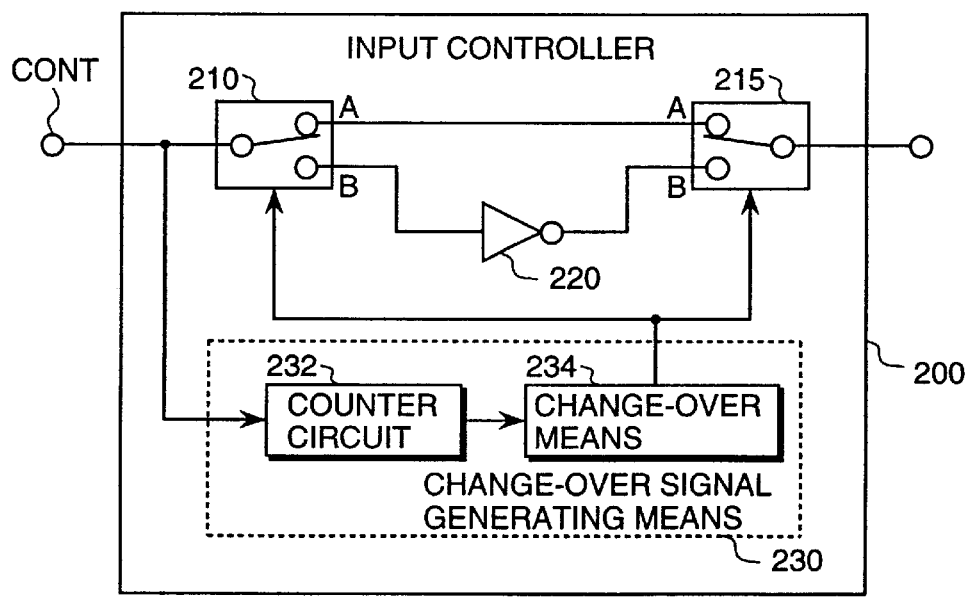
FIG. 17 is a block diagram of a first example of the input controller in the switch circuit having a protection function of a fifth embodiment of the present invention.

The change-over control means 234 operates by this output signal and changes the switches 210 and 215 explained in FIG. 17 to the B side. At the same time, the counter COUNT starts to count pulses outputted from the standard oscillator OSC again.

The count value of the counter COUNT is inputted to the comparator COMP4 and compared with the second predetermined value outputted by the preset circuit PRE2 and when the two coincide with each other, the comparator COMP4 outputs a coincidence signal to the controller CONTR. The controller CONTR receives this coincidence signal and outputs an output signal to the change-over control means 232 and outputs a reset signal to the counter COUNT at the same time. The change-over control means 234 operates by this output signal and changes the switches 210 and 215 explained in FIG. 17 to the A side.

When the operation explained above is repeated hereafter, a desired signal as shown in FIG. 16 can be obtained.

Figure 19:
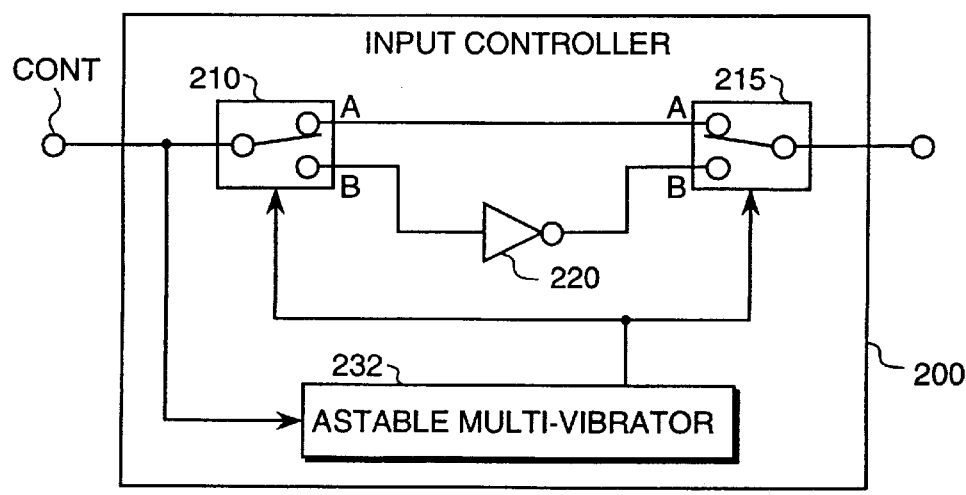
FIG. 19 is a block diagram of a second example of the input controller In the switch circuit having a protection function of a fifth embodiment of the present invention.

FIG. 19 is a block diagram of a second example of the input controller in the switch circuit having protection function of the fifth embodiment of the present invention. Each reference numeral which is the same as that shown in FIG. 17 indicates the same part.

The input controller 20M has an astable multi-vibrator 240 in place of the change-over signal generating means 230 shown in FIG. 17.

Next, the operation of the input controller 200 will be explained by additionally referring to the waveform diagram shown in FIG. 16.

It is assumed that a signal on the continuity level of the MOSFET 110 is inputted to the control input terminal CONT of the input controller 200 at the time T21 shown in FIG. 16 and assumes the interruption level at the time T27.

Before the signal on the continuity level of the MOSFET 110 is inputted before the time T21, the astable multi-vibrator 240 controls both the switches 210 and 215 so as to be changed to the A side. Then, at the time T21, the signal of the control input terminal CONT assumes the continuity level of the MOSFET 110 as shown at the time T21 in FIG. 16.

This control signal is inputted to the astable multi-vibrator 240 at the same time. The astable multi-vibrator 240 inputting the control signal starts operation, retains the switches 210 and 215 on the A side in the current status until the time T22, and outputs an inversion signal to the switches 210 and 215 at the time T22.

The switches 210 and 215 receiving the inversion signal are changed to the B side and the signal on the continuity level of the MOSFET 110 inputted to the control input terminal CONT is inverted to assume the interruption level of the MOSFET 110 by the inverting means 220 via the switch 210 and outputted to the electric power element 100 which interrupts over heating.

Next, the astable multi-vibrator 240 will not output the inversion signal at the time T22'. As a result, both the switches 210 and 215 are changed to the A side and the signal on the continuity level of the MOSFET 110 inputted to the control input terminal CONT is outputted to the electric power element having function to interrupt over heating 100 as it is via the switches 210 and 215.

During the term that the signal on the continuity level of the MOSFET 110 is inputted to the control input terminal CONT like this, the astable multi-vibrator 240 performs an operation of repeatedly outputting a signal for changing to the A side during the period from time T21 to time T22, and a signal for changing to the B side during the period from the time T22 to the time T22' to the switches 210 and 215.

By doing this, a desired signal as shown in FIG. 16 can be obtained.

When the signal on the continuity level of the MOSFET 110 is not inputted to the control input terminal CONT, the output of the astable multi-vibrator 240 is set at an output so that the switches 210 and 215 are changed to the A side.

As explained above, according to this embodiment, even if a current surge flows in the load, the electric power element having a function to interrupt over heating detects a temperature rise caused by an overcurrent flowing in the load when an error occurs in the load without malfunction, due to the rush current, and performs a protection operation for the load. After power supply to the load is interrupted, the electric power element retains the interruption status and does not repeat the unnecessary ON-OFF cycle.

Since the interruption status can be canceled using the reset means, for input of a second control signal on the continuity level, the switch circuit can be energized and power supply to the load can be restarted. When an overcurrent flows in the load, the power supply to the load is interrupted once again and the interruption status can be retained.

Furthermore, the reset means outputs no reset signal unless the temperature detected by the temperature detecting means becomes lower than the interruption canceling temperature. Therefore, for repetition of the cycle of turning a lamp ON or OFF or frequent repetition of running or stopping of a motor, the reset means retains the interruption status and the load can be protected from an unnecessary over-current.

Even if the load is instantaneously short-circuited or a load having a large current is instantaneously connected, the reset means 150 operates so as to cancel the interruption status.

Figure 20:
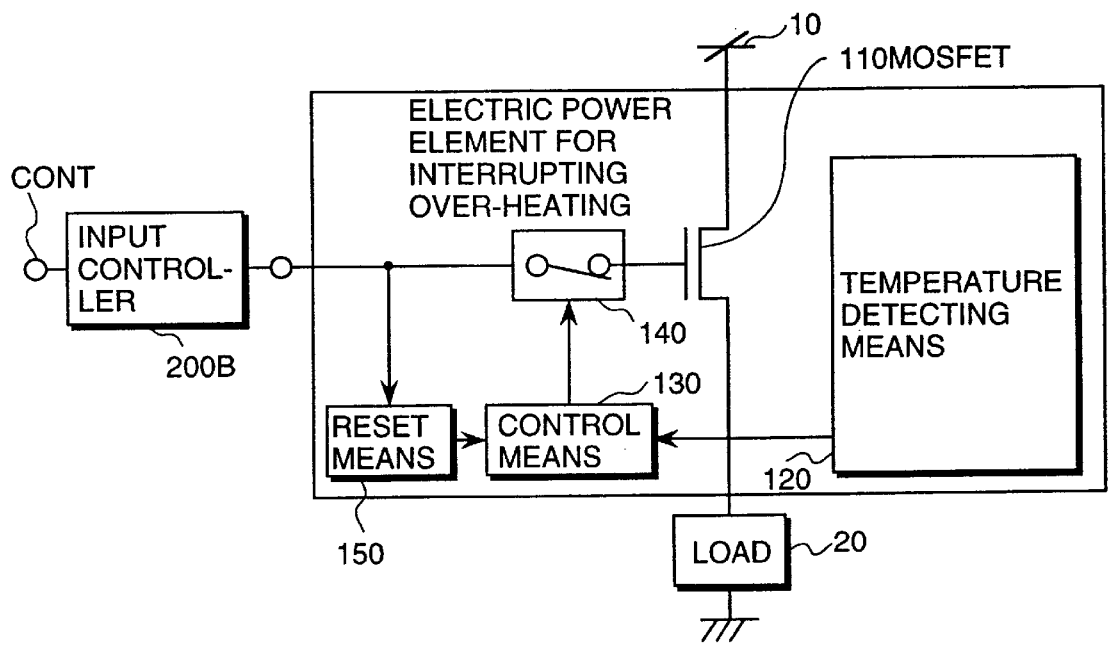
FIG. 20 is a block diagram of the switch circuit having a protection function of a sixth embodiment of the present invention.

Next, the constitution and operation of a switch circuit having protection function of the sixth embodiment of the present invention will be explained by referring to FIGS. 20 to 23. The overall constitution of a protected switch circuit according to a sixth embodiment of the present invention is shown in FIG. 20. Each reference numeral which is the same as that shown in FIG. 14 indicates the same part.

According to this embodiment, the constitution of the input controller 200B is different from that of the embodiment shown in FIG. 14. That is, in the embodiment shown in FIG. 14, the input controller 200 outputs an interrupt signal only during the predetermined term on the basis of the control signal inputted from the control input terminal CONT. On the other hand, according to this embodiment, the input controller 200B outputs a signal which assumes the interruption status at a predetermined interval, independently of the control signal inputted from the control input terminal CONT.

Figure 21:
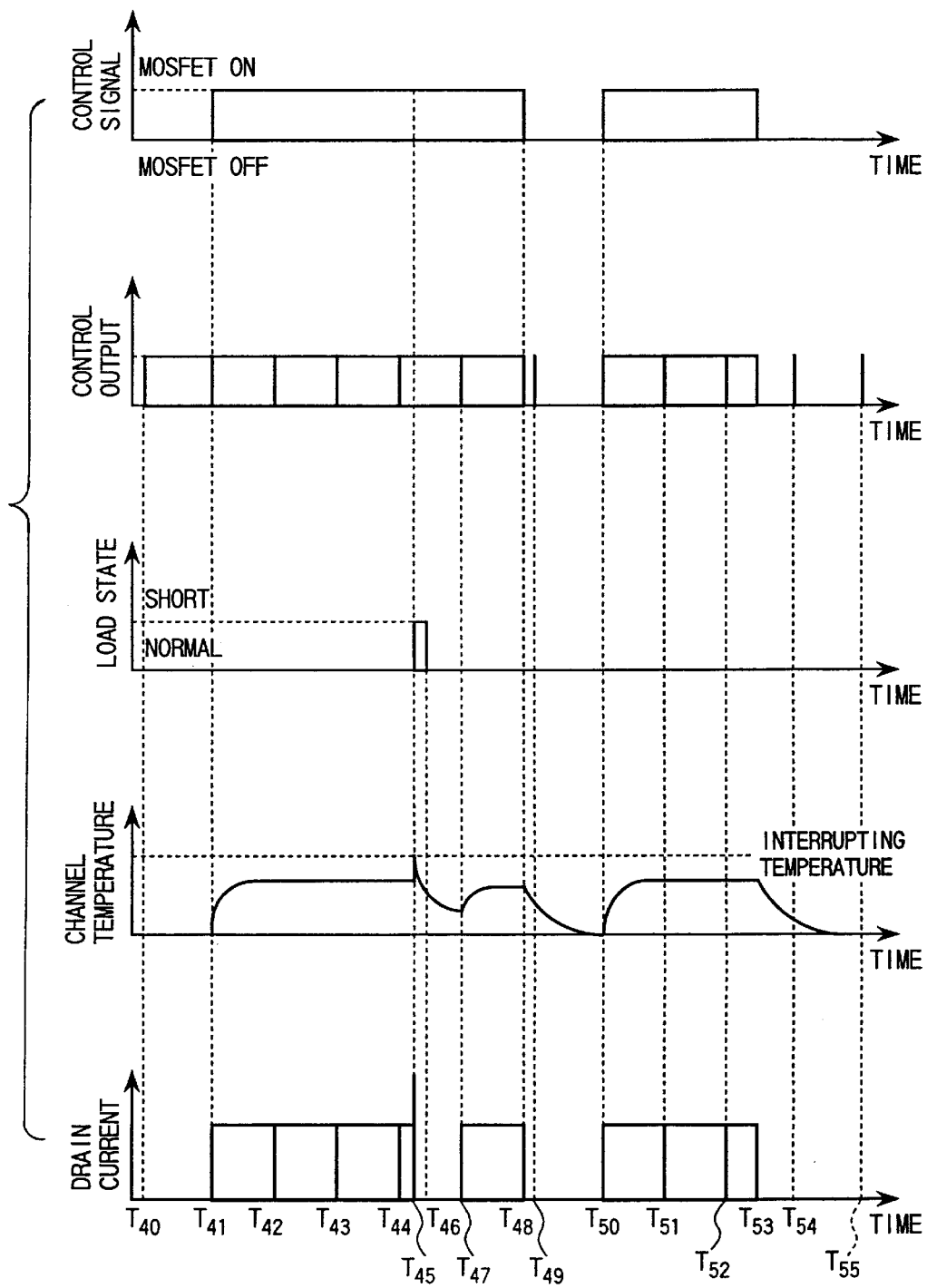
FIG. 21 shows waveform diagrams for explaining the operation of the switch circuit having a protection function of a sixth embodiment of the present invention.

Next, the operation of the input controller 200B in this embodiment will be explained by referring to FIG. 21. FIG. 21 shows waveform diagrams for explaining the operation of a protected switch circuit according to the sixth embodiment of the present invention. FIG. 21(A) shows a control signal inputted from the control input terminal CONT shown in FIG. 20; FIG. 21(B) shows an output signal of the input controller 200; FIG. 21(C) shows the status of the load; FIG. 21(D) shows the channel temperature of the MOSFET 110 detected by the temperature detecting means 120, and FIG. 21(E) shows a drain current of the MOSFET 110 flowing in the load 20.

In the embodiment shown in FIG. 20, it is assumed that the control signal inputted to the control input terminal CONT has a signal waveform as shown in FIG. 21(A). Namely, between the time T41 and T48 and between the time T50 and T53, the control signal assumes a value for putting the MOSFET 110 on the continuity level.

This control signal is converted to a signal having the waveform as shown in FIG. 21(B) by the input controller 200. Each bold vertical line shown at the time T40, T42, T43, T44, T47, T49, T50, T51, T52, T54, T55, etc. indicates an inversion signal for briefly putting the MOSFET 110 on the interruption level. The details of the inversion signals for putting the MOSFET 110 on the interruption level are as explained in FIG. 16. In this embodiment, these inversion signals are generated at a fixed interval over the whole term as shown in FIG. 21(B) independently of the control signal inputted from the control input terminal CONT.

Also in this embodiment, in the same way as with the embodiment explained by referring to FIGS. 14 and 15, it is assumed that the load is short-circuited at the time T45 and returned to the normal status at the time T46.

Also in this embodiment, a signal on a level at which the MOSFET 110 is interrupted for a short time is inputted at the time T47, so that the control means 130 is reset by the reset: means 150 at the time T47, the MOSFET 110 is energized, and a drain current flows. In this manner, control for interrupting once and resetting after a certain time is made possible.

Next, an actual circuit constitution of the input circuit 200B will be explained by referring to FIG. 22.

Figure 22:
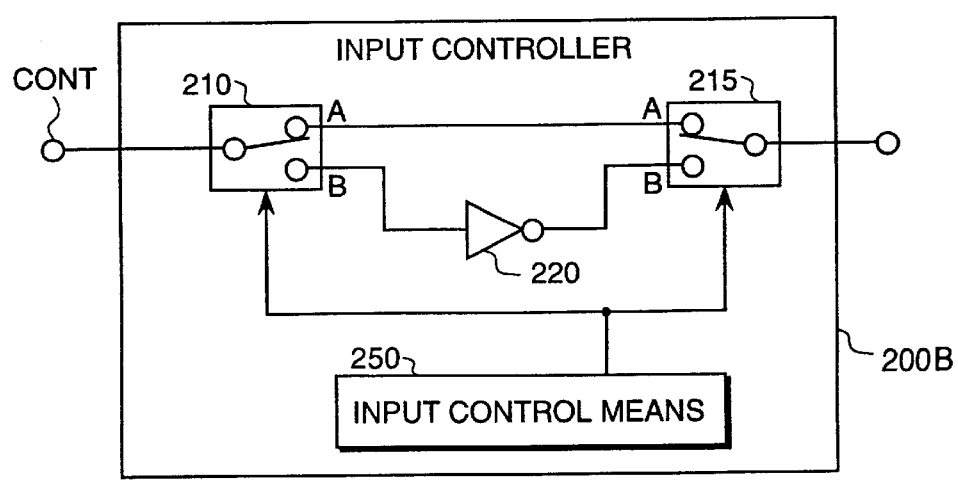
FIG. 22 is a block diagram of a first example of the input controller in the switch circuit having a protection function of a sixth embodiment of the present invention.

FIG. 22 is a block diagram of a first example of the input controller in the protected switch circuit according to the sixth embodiment of the present invention. Each same numeral as that shown in FIG. 17 indicates the same part.

In this embodiment, the timing for generating an inversion signal for putting the MOSFET 110 on the interruption level is created by the input control means 250. The input control means 250 operates asynchronously with a control signal inputted from the control input terminal CONT, unlike the change-over signal generating means 230 explained in FIG. 17.

In this embodiment, when a control signal as shown in FIG. 21(A) is inputted from the control input terminal CONT, the input controller 200B operates so as to output a signal as shown in FIG. 21(B).

The operation is as follows: the input control means 2,50 controls the switches 210 and 215 so as to change them to the A side respectively only during the first predetermined time, and controls the switches 210 and 215 so as to change them to the B side respectively only during the second predetermined time. The input control means 250 repeats the control for the switches 210 and 215 during the first predetermined time and the second predetermined time. During the term that the switches 210 and 215 are controlled on the B side, a signal inputted from the control input terminal CONT is outputted via the inverting means 220, so that a desired signal as shown in FIG. 21(B) can be obtained.

As the input control means 200B, for example, an astable multi-vibrator can be used. The astable multi-vibrator controls the switches 210 and 215 so as to change them to the A side respectively only during the first predetermined time and controls the switches 210 and 215 so as to change them to the B side respectively only during the second predetermined time. The astable multi-vibrator is structured so as to become astable, so that it repeats the control for the switches 210 and 215 during the first predetermined time and the second predetermined time.

In this embodiment, the input control means 250 may control the switches by a means such as a microcomputer using software. In this case, the first predetermined time and the second predetermined time can be changed only by changing the software.

Next, the time duration of the inversion signal for putting the MOSFET into the interruption status by the input controller will be explained by referring to FIG. 23.

Figure 23:
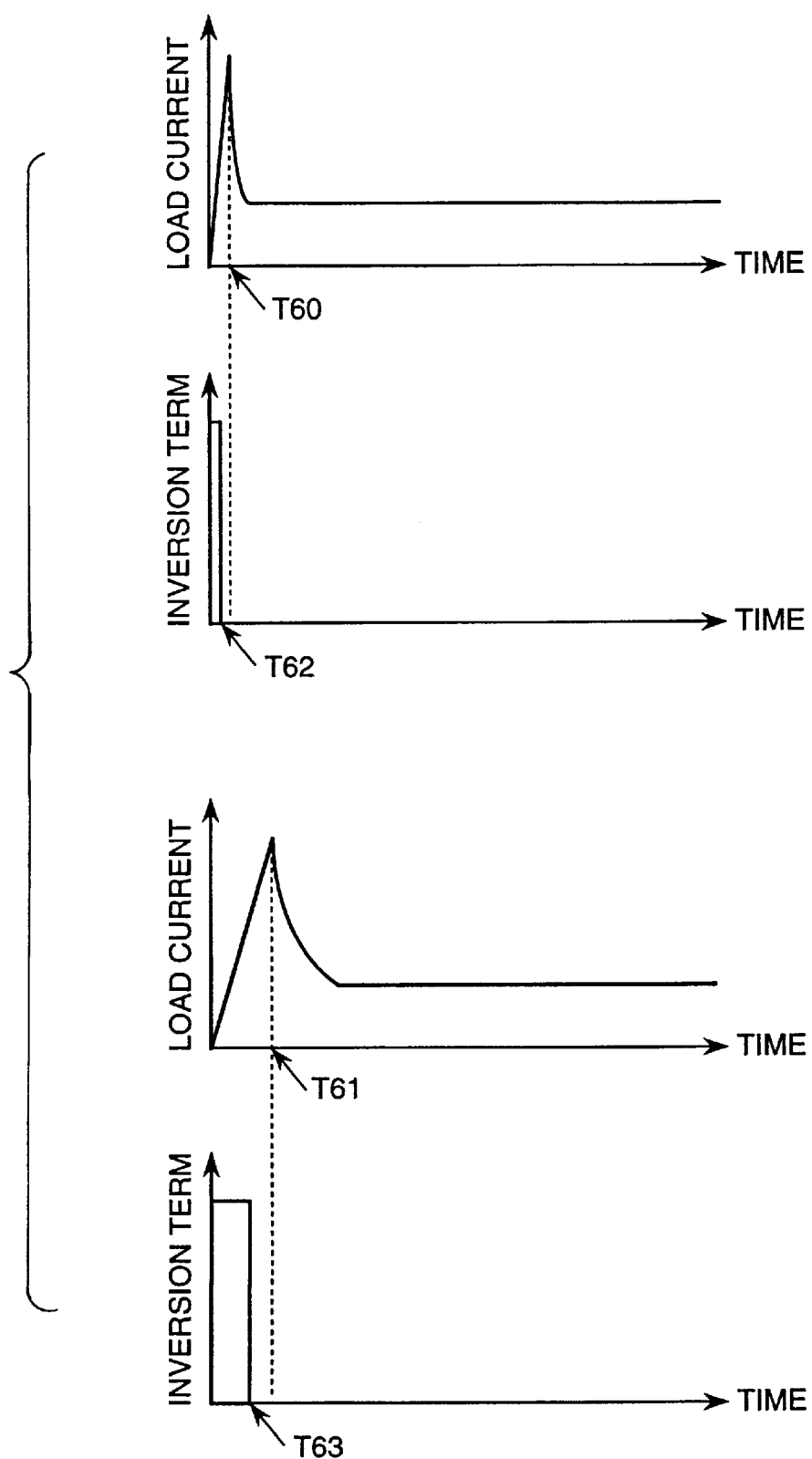
FIG. 23 illustrates the time width of an inversion signal of the input controller in the switch circuit having a protection function of a sixth embodiment of the present invention.

FIG. 23 shows illustrations for the time duration of the inversion signal of the input controller in the protected switch circuit according to the sixth embodiment of the present invention.

In FIG. 23, the 0 point on the horizontal axis indicates a point of time when the voltage is applied. with respect to the load 20 shown in FIG. 20, there are cases where as Shown in FIG. 23(A), a large current surge flows at the time T60 immediately after the voltage is applied and as shown in FIG. 23(C), a large current surge flows at the time T61 slightly later than the tire T60. The response speed of the peak of the current surge varies with the load in this manner. For example, a lamp of a car conforms to the characteristic shown in FIG. 23(A), and a motor of a car conforms to the characteristic shown in FIG. 23(C).

Therefore, when the signal term (inversion signal term) on the interruption level of the MOSFET 110 is inserted in the signal term on the continuity level of the MOSFET 110, depending on the signal term on the continuity level, a current surge flows and furthermore the size of current surge also varies.

Therefore, when the time is early as shown in FIG. 22(A: according to the response speed of the peak of the current surge of the load 20, as shown in FIG. 22(B), the term on the interruption level of the MOSFET 110 such as the width (the time T62) which is shorter than the term from voltage application to the time T60 (and for which the reset means 150 can determine the reset) is set. When the time is not early as shown in FIG. 22(C), the signal term on the interruption level of the 140SPET 110 such as the width (the time T63) which is shorter than the term from voltage application to the time T61(and for which the reset means 150 can determine the reset) is set.

As mentioned above, the width of inversion term to be inserted is changed for different loads 20.

On the other hand, even if the short signal term on the interruption level of the MOSFET 110 is inserted in the signal term on the continuity level of the MOSFET 110 represented by FIG. 16, when the load is different, the effect is different even during the same short signal term on the interruption level of the MOSFET 110. In this case, in the same way as with the example explained by referring to FIG. 23, the term width for inverting the control signal is changed.

As mentioned above, the term width for inverting the control signal is changed depending on a difference of the load due to resistance, capacitive, and inductive or a combination of them and load current. As a means for changing the term width, the following method can be used.

In FIG. 17, any one of the following methods is acceptable: changing the term of the counter circuit using a time constant established, for example, by a combination of resistance and capacity; changing the standard value for comparing the count value of the counter circuit 232 by an external switch; storing the standard value for comparing the count value of the counter circuit 232 in a storing means such as EPROM in the same way and changing the value; and changing software when the change-over signal generating means 230 comprises a microcomputer.

As explained above, according to this embodiment, even if a current surge flows in the load, the overheating protected electric power element detects a temperature rise caused by an overcurrent flowing in the load when an error occurs in the load without malfunction, due to the current surge, and performs a protection operation for the load. After power supply to the load is interrupted, the electric power element retains the interruption status, and does not repeat the unnecessary ON-OFF cycle.

Since the interruption status can be canceled using the reset means, for input of a second control signal on the continuity level, the switch circuit can be energized and power supply to the load can be restarted. When an overcurrent flows in the load, the power supply to the load is interrupted once again and the interruption status can be retained.

Furthermore, the reset means outputs no reset signal unless the temperature detected by the temperature detecting means becomes lower than the interruption canceling temperature. Therefore, for repetition of the cycle for turning a lamp ON or OFF or frequent repetition of running or stopping of a motor, the reset means retains the interruption status and the load can be protected from an unnecessary over-current.

The overheating protected electric power element cancels the interruption status by operation of the reset means 150, even if the load is instantaneously short-circuited or a load having a large current is instantaneously connected.

Figure 24:
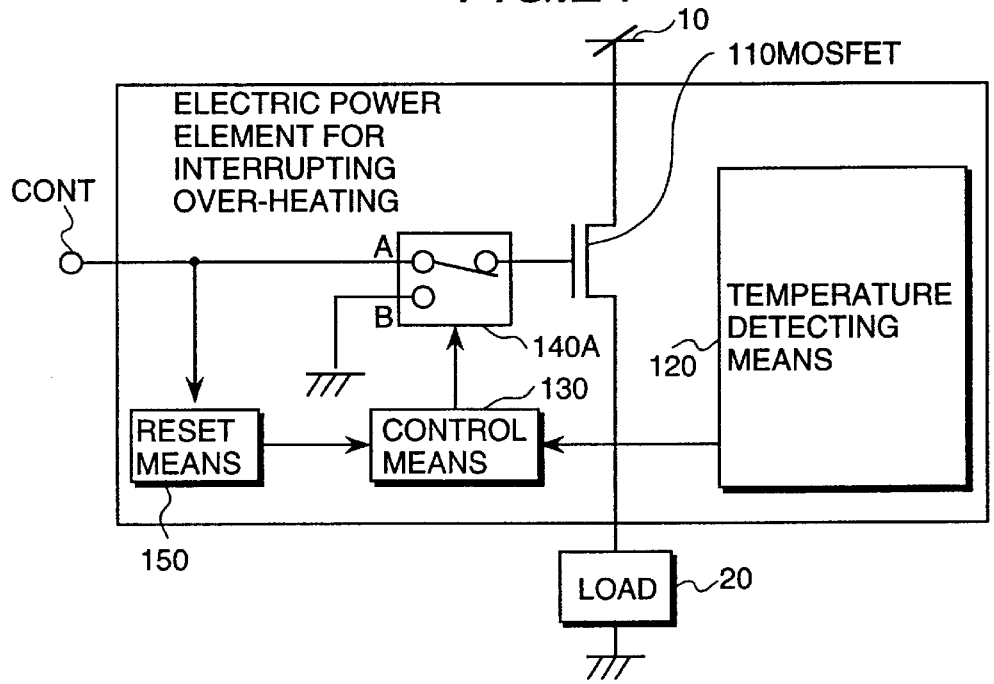
FIG. 24 is a block diagram of the switch circuit having a protection function of a seventh embodiment of the present invention.

Next, the overall constitution of a protected switch circuit according to a seventh embodiment of the present invention will be explained by referring to FIG. 24. Each reference numeral which is the same as that shown in FIG. 5 indicates the same part.

In this embodiment, the switch 140A differs from the switch 140 in the embodiment shown in FIG. 5. Namely, in switch 140A one of the change-over terminals is grounded.

Also in this embodiment, as explained in FIG. 6, when a control signal as shown in FIG. 6(A) is inputted from the control input terminal CONT at the time T1, the MOSFET 110 is energized. And, as shown in FIG. 6(C), a current flows in the load 20.

In this case, as shown in FIG. 6(B), the channel generates heat by the channel resistor of the MOSFET 110 and the channel temperature rises. When the current is excessive, the channel temperature slowly rises as shown in FIG. 6(B) and for example, at the time T2, it is assumed that the channel temperature reaches the predetermined interrupting temperature. The control means 130 inputting the temperature information signal compares the predetermined interrupting temperature and the inputted temperature information signal. When the control means 130 judges that the inputted temperature information signal becomes higher than the interrupting temperature, the control means 130 outputs an interruption signal so as to interrupt the switch 140A and cuts off the input signal of the MOSFET 110.

In this case, the gate terminal of the MOSFET 110 is connected to the grounding terminal connected to the B side via the switch 140A. Therefore, the charge stored in the gate of the MOSFET 110 discharges, so that the time until the MOSFET 110 is turned off can be shortened.

The control means 130 retains the interruption status of the switch 140A. On the other hand, when the gate input to the MOSFET 110 changes from an interrupt value to a value at which the gate input of the MOSFET 110 is energized, according to this embodiment, a control signal to be inputted to the control input terminal CONT is inputted to the reset means. When the latter signal detects a change point where the continuity level of the MOSFET 110 moves to the interruption level, the control signal interrupting the switch 140A of the control means 130 is canceled, and the switch 140A is mood to the continuity status. The input of the MOSFET 110 controlling the switch 140A like this is moved and reset from the interruption status to the continuity status. The overheating protected electric power element can be realized by the aforementioned operation.

According to this embodiment, the charge stored in the gate of the MOSFET 110 discharges via the grounding terminal, so that the time until the MOSFET 110 is turned off can be shortened.

Figure 25:
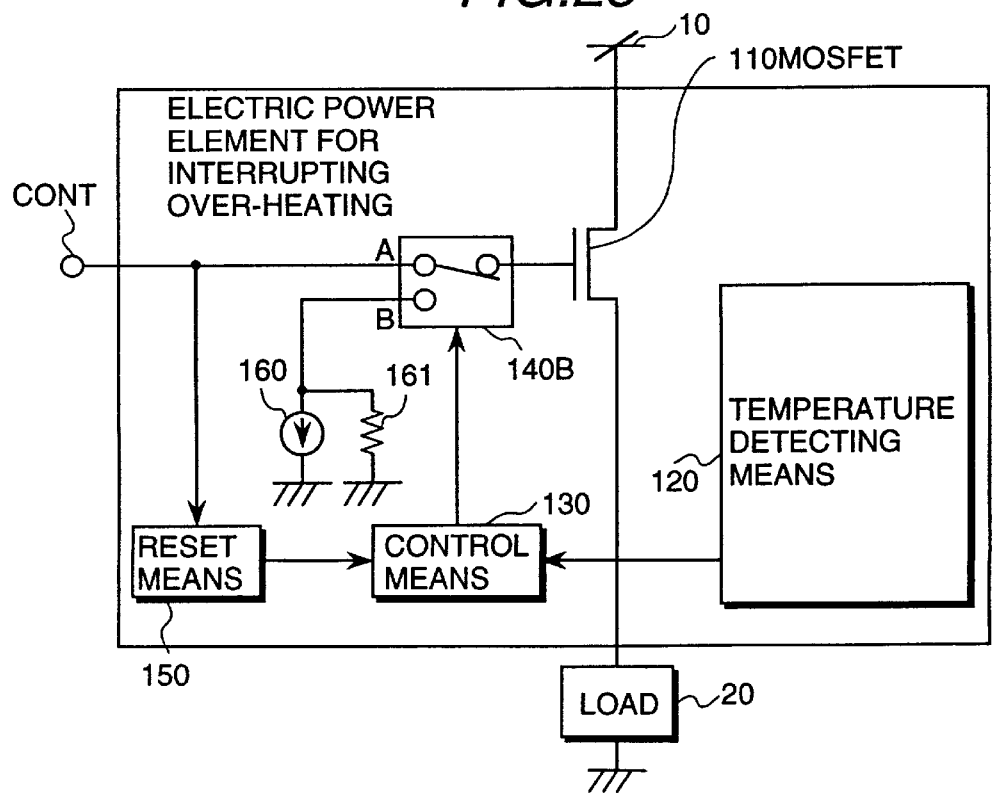
FIG. 25 is a block diagram of the switch circuit having a protection function of eighth embodiment of the present invention.

Next, the overall constitution of a protected switch circuit according to an eighth embodiment of the present invention will be explained by referring to block diagram in FIG. 25. Each reference numeral which is the same as that shown in FIG. 24 indicates the same part.

In this embodiment, the switch 140B is a switch circuit in which a current source 160 and a resistor 162 are connected to one (B side) of the change-over terminals.

The control means 130 receiving the temperature information compares the inputted temperature information with a predetermined interrupting temperature. When the control means 130 judges that the indicated temperature is higher than the predetermined interrupting temperature, it controls the switch 140B to the B side and interrupts an input signal to the MOSFET 110. The MOSFET 110 for which the input is interrupted enters the interruption status, so that the drain current (and hence the current supply to the load 20) is interrupted.

In this case, the gate terminal of the MOSFET 110 is connected to the current source 160 and the resistor 162 connected to the B side via the switch 140B. Therefore, the charge stored in the gate of the MOSFET 110 is led in and discharged by the current source 160, so that the time until the MOSFET 110 is turned off can be shortened.

The control means 130 retains the interruption status of the switch 140B. On the other hand, when the the gate input of the MOSFET 110 is changed from an interrupted status (by the switch 140B) to a state in which the gate input of the MOSFET 110 is energized, according to this embodiment, a control signal to be inputted to the control input terminal CONT is inputted to the reset means. When the latter signal detects a change point where the continuity level of the MOSFET 110 moves to the interruption level, the control signal interrupting the switch 140A of the control means 130 is canceled, and the switch 140A moves to the continuity status.

The input of the MOSFET 110 is moved and reset from the interruption status to the continuity status this manner. The overheating protected electric power element can be realized by the aforementioned operation.

According to this embodiment, the charge stored in the gate of the MOSFET 110 is led in and discharged by the current source 160r so that the time until the MOSFET 110 is turned off can be shortened.

Next, the constitution of the input controller in the protected switch circuit according to a ninth embodiment of the present invention will be explained by referring to FIGS. 26 to 28.

Figure 26:
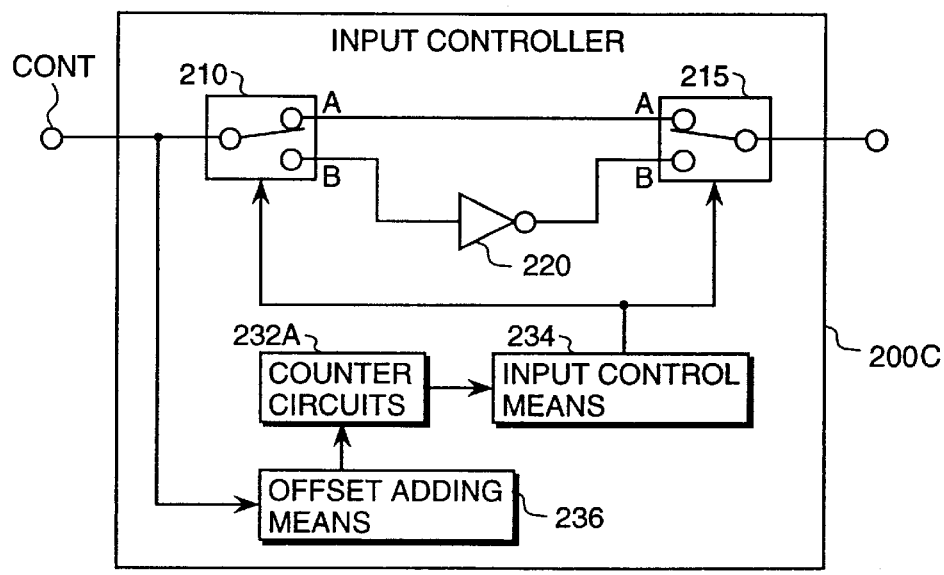
FIG. 26 is a block diagram of the switch circuit having a protection function of a ninth embodiment of the present invention.

FIG. 26 is a block diagram of the switch circuit having protection function of the ninth embodiment of the present invention. Each reference numeral which is the same as that shown in FIG. 17 indicates the same part.

In this embodiment, the input controller 200C is used in place of the input controller 200 shown in FIG. 17. The overall constitution of the switch circuit having a protection function is the same as that shown in FIG. 14.

The input controller 200C outputs a signal which enters the interruption status independently of the control signal from the control input terminal CONT, so that the interval increases gradually.

The input controller 200C has an offset adding means 236 in addition to the constitution shown in FIG. 17. The counter circuit 232A is slightly different from the counter 232 shown in FIG. 17 and can be preset by latching an offset value given from the offset adding means 236.

Next, the counter circuit 232A and the offset adding means 236 will be explained by referring to the block diagram of FIG. 27. Each reference numeral which is the same as that shown in FIG. 18 indicates the same part.

The counter circuit 232A has a latch circuit LAT in addition to the constitution of the counter circuit 232 shown in FIG. 18.

The offset adding means 236 comprises a controller CONTR1 and a memory MEM. In the memory MEM, a plurality of offset values such as a first offset value and a second offset value are stored.

Figure 28:
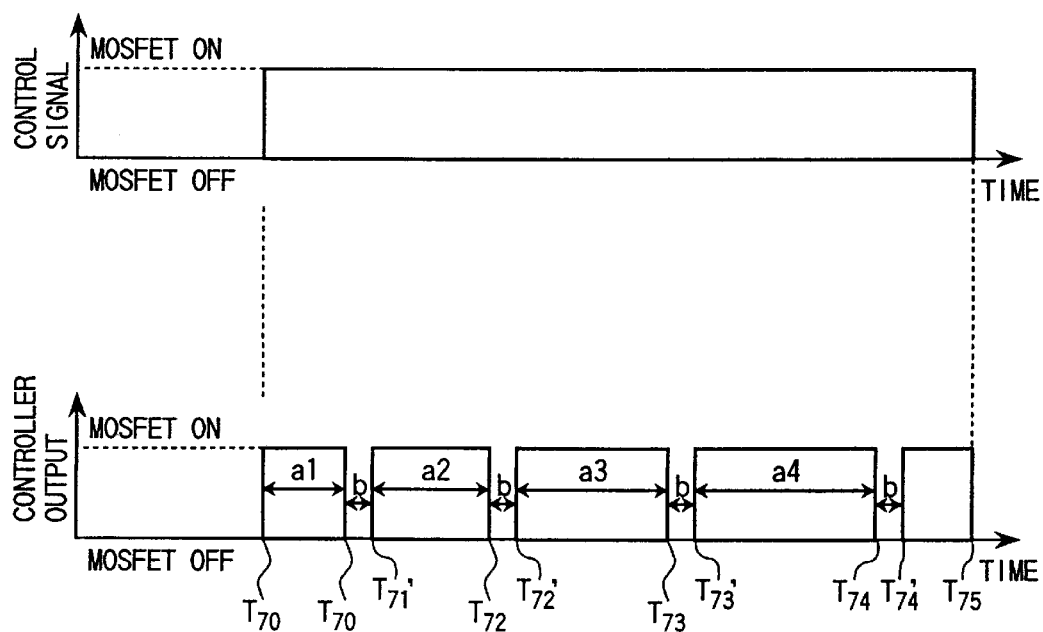
FIG. 28 is waveform diagrams of the counter circuit and offset adding means of the switch circuit having a protection function of a ninth embodiment of the present invention.

FIG. 28 shows waveform diagrams of the counter circuit and the offset adding means of the protected switch circuit according to the ninth embodiment of the present invention. The upper waveform shows a control signal inputted from the control input terminal CONT and the lower waveform shows an output signal of the input controller 200.

It is assumed that a MOSFET ON signal is inputted to the control input terminal CONT shown in FIG. 26 at the time T70 shown in FIG. 28 and turned off at the time T75. Before the MOSFET ON signal of the control input terminal CONT is inputted at time T70, the change-over control means 234 controls both the switches 210 and 215 so as to be changed to the A side. As a result, at the time T70, the signal of the control input terminal CONT assumes a MOSFET ON level as shown at the time T70 in FIG. 28. This control signal is inputted to the counter circuit 232A and the offset adding means 236 at the same time.

Figure 27:
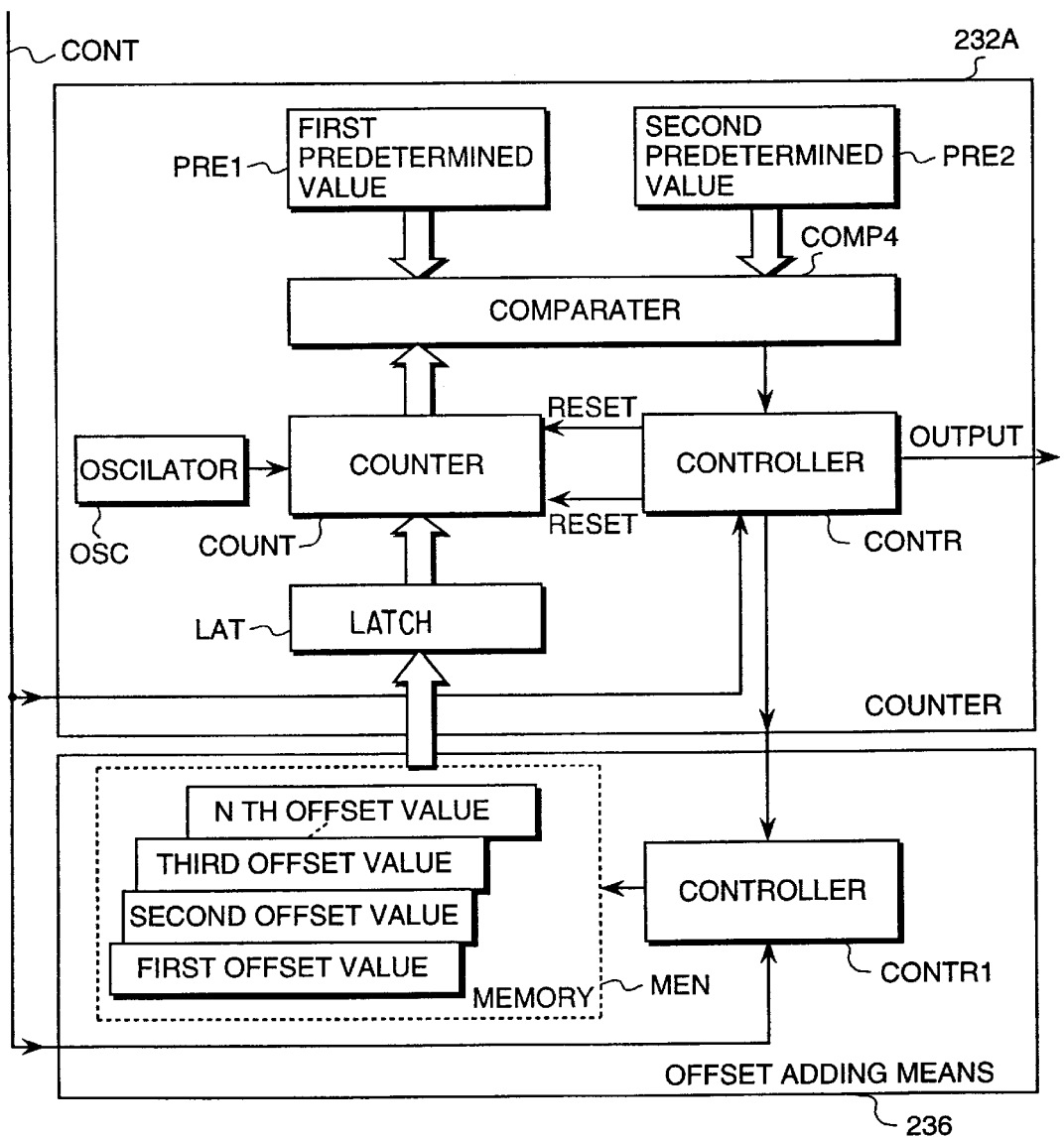
FIG. 27 is a block diagram of the counter circuit and offset adding means of the switch circuit having a protection function of a ninth embodiment of the present invention.

As shown in FIG. 27, the offset adding means 236 inputting the control signal resets the offset value and outputs the first offset value which is a standard value to the counter circuit 232A. The first offset value is latched by the latch LAT of the counter circuit 232.

On the other hand, the counter circuit 232A inputting the control signal resets the counter COUNT, presets the first offset value latched by the latch LAT in the counter COUNT, and starts counting pulse signals from the standard oscillator OSC. The counter COUNT of the counter circuit 232A starts counting from the first offset value fetched from the offset adding means 236.

The comparator COMP4 adds only the predetermined value to the first offset value, and counts until the value becomes equal to the first predetermined value PRE1, at which time it outputs a coincidence signal to the controller CONTR and the controller CONTR outputs a first output to the change-over control means 234 (FIG. 26). This occurs at time T71 shown in FIG. 28.

Upon receipt of the first output from the counter circuit 232A, the change-over control means 234 outputs a changeover signal to the switches 210 and 215 and changes the switches to the B side. Therefore, a signal of the control input terminal CONT is inverted by the inverting means 220 via the switch 210 and outputted via the switch 215, so that it assumes a MOSFET OFF value as FIG. 28.

The counter COUNT starts counting again. When it counts up to the second predetermined value PRE2, it outputs a coincidence signal, and the controller CONTR outputs a second output to the change-over control means 234 and the offset adding means 236.

Upon receipt of the second output, the change-over control means 234 outputs a change-over signal to the switches 210 and 215 and changes the switches to the A side. The signal inputted to the control input terminal CONT is outputted via the switch 215 which is directly connected via the switch 210, so that a MOSFET ON signal is outputted as shown at the time T71' shown in FIG. 28.

The controller CONTR receiving the second output outputs an increment signal to the controller CONTR1 of the offset adding means 236 and resets the counter CONT. The controller CONTR1 of the offset adding means 236 outputs the second offset value next and latches it in the latch LAT. The second offset value is preset in the counter COUNT.

The counter circuit 232A starts counting again and shown at the time T71 shown in counts up to the predetermined number of pulses in the second offset received from the offset adding means 236. When the value becomes equal to the first predetermined value PRE1, the comparator COMP outputs the first output to the change-over control means 234 via the controller CONTR.

In this case, for example, assuming the first predetermined value as 100, the first offset value as 90, and the second offset value as 80, it is possible that when 10 is counted for the first offset value, the first output is outputted and when 20 is counted for the second offset value, the second output is outputted next. Namely, when the offset value is properly selected such as a1=10 and a2=20 shown in FIG. 28(B), the width "an of the inversion signal can be, made progressively wider. The OFF term "b" is uniquely decided by the second predetermined value.

According to this embodiment, since the interval reset by the inversion signal is spread when the load 20 is permanently short-circuited, the MOSFET ON count per unit time reduces and the damage due to heat generation by the rush current at the time of short-circuit can be reduced.

Figure 29:
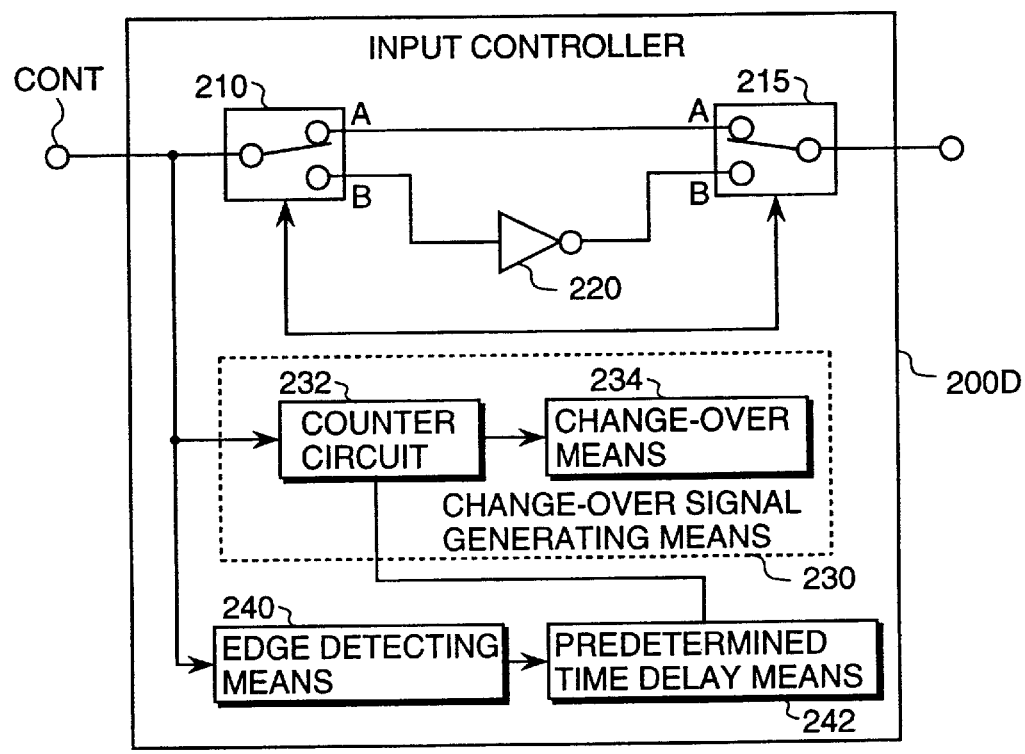
FIG. 29 is a block diagram of the switch circuit having a protection function of a tenth embodiment of the present invention.

Next, the constitution of the input controller in the protected switch circuit according to a tenth embodiment of the present invention will be explained by referring to the block diagram in FIG. 29. Each reference numeral which is the same as that shown in FIG. 17 indicates the same part.

The input controller 200D in this embodiment has an edge detecting means 240 and a predetermined time delay means 242 in addition to the constitution shown in FIG. 17.

The edge detecting means 240 detects the edge (where the MOSFET 110 changes from the continuity status to the interruption status) of the control signal from the control input terminal CONT. When an edge is detected it sends an edge detection signal to the predetermined time delay means 242. When the predetermined time $T_{pre}$ elapses after edge detection, the predetermined time delay means 242 outputs a count stop signal to the counter 232, which stops counting.

Therefore, until the predetermined time $T_{pre}$ elapses after the MOSFET 110 changes from the continuity status to the interruption status, an inversion signal is generated and the return operation is performed. However, after the predetermined time $T_{pre}$ elapses, no inversion signal will be generated, so that when no reset is caused by the reset means and the MOSFET 110 is kept in the interruption area for many hours, the power consumption can be reduced.

The edge detecting means 240 and the predetermined time delay means 242 can be applied also to the embodiment shown in FIG. 19 and by output of the predetermined time delay means 242, the oscillation of the multi-vibrator 240 can be stopped. Furthermore, the edge detecting means 240 and the predetermined time delay means 242 can be applied also to the embodiment shown in FIGS. 22 and 26 and by output of the predetermined time delay means 242, the control of the input control means 250 (FIG. 22) and the counting of the counter circuit 232(FIG. 26) can be stopped.

Figure 30B:
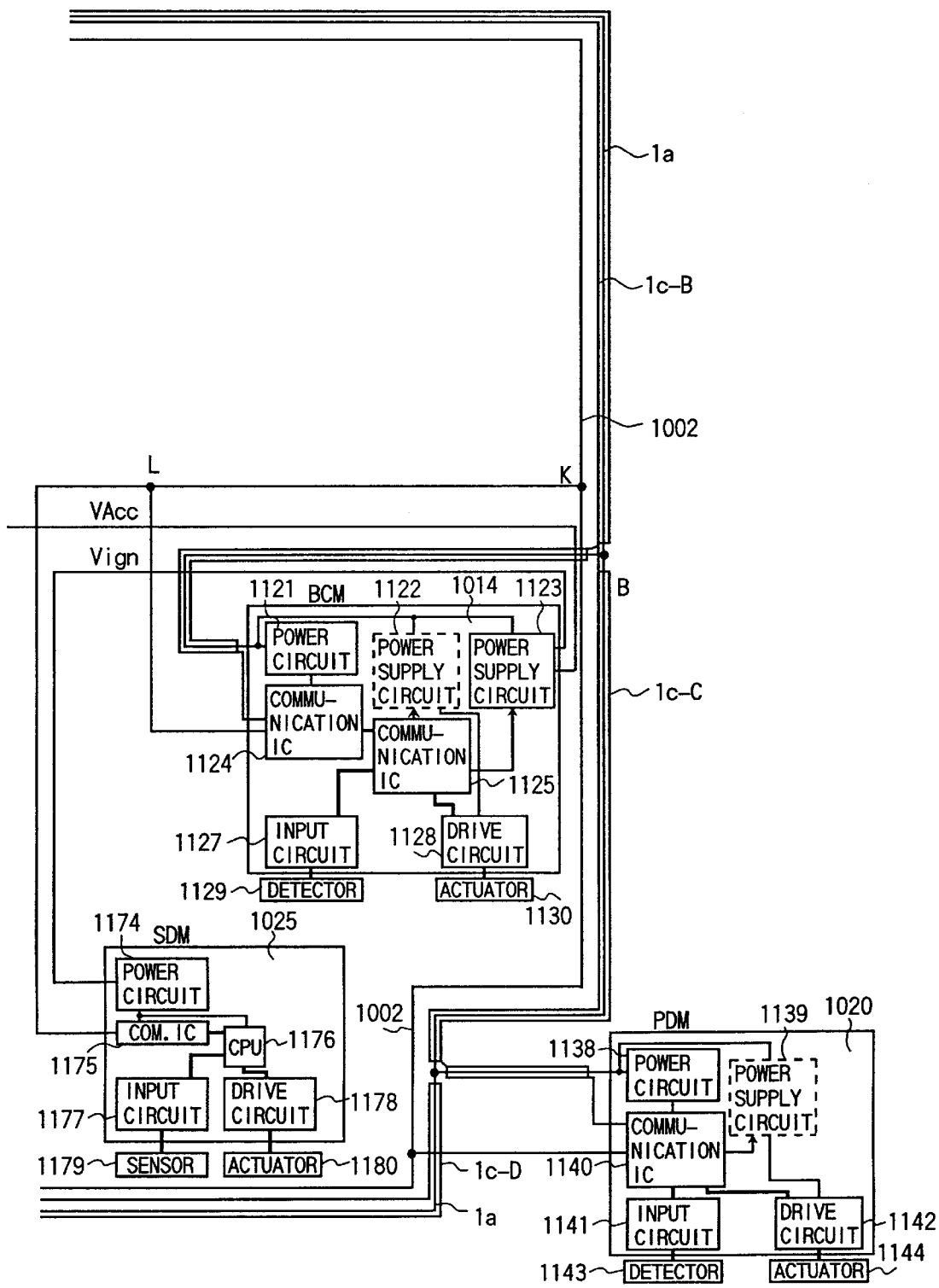
Figure 30C:
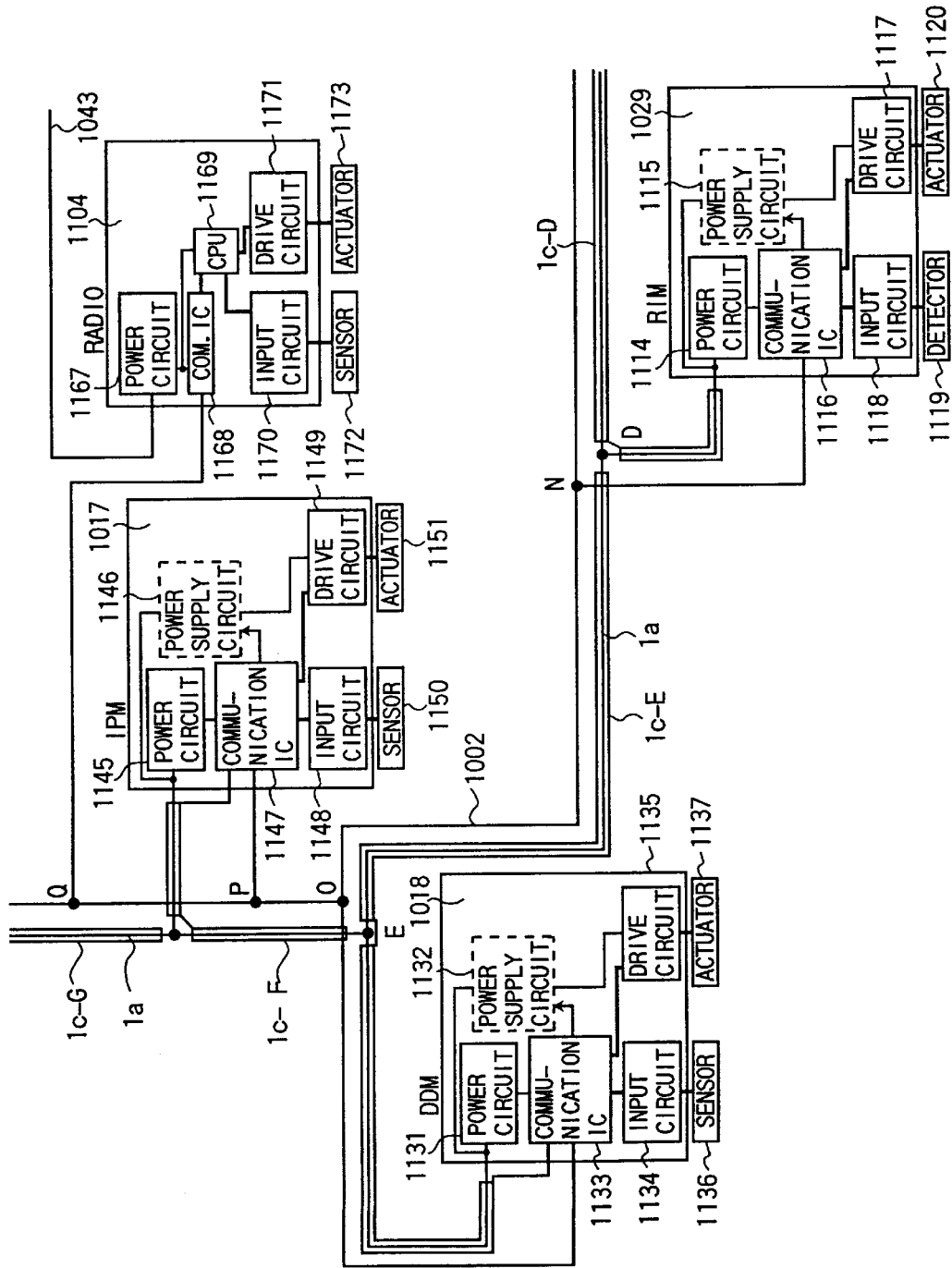

FIGS. 30A, 30B and 30C contain a block diagram of one embodiment of the electric power supplying apparatus. and intensive wiring apparatus for vehicles according to the present invention. As found in those figures, the automobile realized with this embodiment has a battery 1003 as an electric power supply, and a generator 1101 driven by the engine.

In the battery 1003, the minus-side terminal (the other terminal) is made to be connected to the body of the automobile. With this structure (that is, single-sided earth electric power supply method), electric power is supplied to the individual electric loads in the automobile, and the plus-side terminal (one terminal) is connected to the wire 1040 through the fusible link 1004, from which the electric power is supplied to the individual electric loads.

The electric power generator 1101 is connected to the plus-side terminal of the battery 1003 through the fusible link 1102, with which the battery 1003 is charged up.

In addition, the starter motor 1100 is directly connected to the plus-side terminal of the battery 1003, and similarly, the electric power is supplied directly to the motor (described later) for ABS (Anti Lock Brake System), in which a large current is applied, through the fusible link 1103.

The Front Integrated Module (FIM) 1005 is located in the front side of the engine compartment, near the head lamps and the turn signal lamps, to which it, along with is connected to the hones mounted around them, so as to drive them.

The component 1010 is a Power Train Control Module (PCM) for controlling the fuel oil consumption and the ignition timing as well as the operation of the transmission. It is located near the engine, in which many sensors and actuators to be controlled and used for engine control are mounted.

Various kind of sensors such as air flow meter and water temperature sensor, and various kinds of actuators such as injectors and cooling fan motors are connected to PCM 1010.

The component 1011 is an ABS control Module, and is mounted next to the ABS actuator in the back-side of the engine compartment. The electric power is supplied directly to the actuator 1158 of the ABS control module 1011 independently through the fusible link 1103 from the battery 1003.

The component 1014 is a Body Control Module (BCM) located near the dash, because it is connected to the devices and the key switch around the steering.

The component 1017 is an Instrument Panel Module (IPM) mounted inside the instrument panel meter, and used for driving the lamps and meters in the instrument panels.

The component 1018 is a Driver Door Module (DDM) mounted in the driver's side door, while the DDM 1010 is mounted in the navigator's seat side door, to which the door lock motor, the power window motor, the door lock switch and the power window switch are connected.

The component 1025 is an Air Bag Control Module (SDM) mounted near the center console.

The component 1029 is a Rear Integrated Module (RIM) located in the front side of the trunk, near the tail lamps and the turn signal lamps, to which it is connected in addition to the door lock motor and the power window motors in the rear doors.

As described above, the individual module is so located near the device to which the corresponding module is connected, as to make the length of the harness linking between the modules and the devices shorter.

The individual modules, FIM 1005, IPM 1017, DDM 1018, PDM 1020 and RIM 1029 have a communication means for exchanging data with another module, and an interface to the Is/O devices connected to the modules. Although in this embodiment, arithmetic processor apparatus (CPU) is not used, it is of course allowed to install a CPU as a modification embodiment of the present invention.

Next, the configuration of the electric power supply system for the individual module is described.

Figure 33:
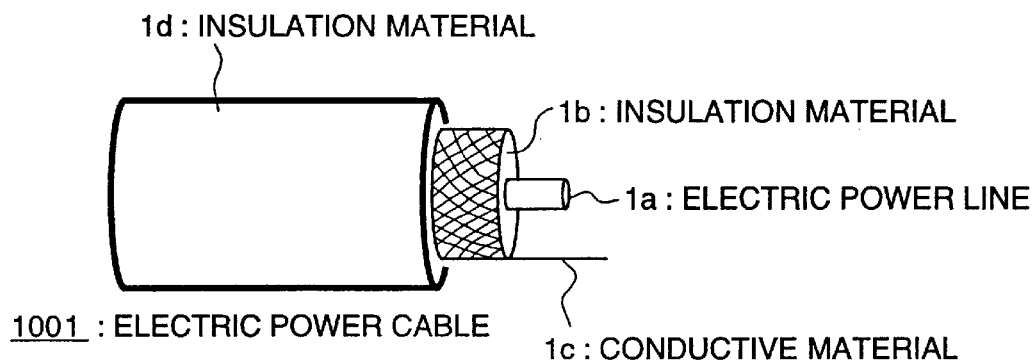
FIG. 33 is a block diagrams showing an embodiment of an electric power cable used in the present invention.

In FIGS. 30A, 30B, 30C, the component 1001 is an electric power cable. As shown in FIG. 33, the electric power cable 1 has the electric power line 1a at its axial center, and comprises the insulation material 1b covering co-axially the electric power line 1a, the electric conductive body 1c covering coaxially the insulation material 1b and the insulation material 1d covering co-axially the electric conductive material 1c.

The electric power line 1a is generally made of single copper wire or twisted copper wire, and is used for the electric conductive line for supplying the electric power.

The insulation material 1b is composed of rubber and plastic used for insulating the electric power line 1a.

The electric conductive body 1c is made from fine copper mesh formed in the co-axial layer around the insulation material 1b, and is used for a short sensor.

In addition, the insulation material 1d is made of rubber and plastics and used as a protection layer for the cable.

The electric power cable 1001 is so laid out that as shown in FIGS. 30A, 30B, 30C, 31 to 34, the closed loop may pass through the neighboring areas of the designated modules mounted inside the body of the automobile; that is, the modules FIM 1005, BCM 1014, PDM 1020, RIM 1029, DDM 1018 and IPM 1017 clockwise on the loop shown.

In addition, the electric conductive body 1c of the electric power cable 1001 is separated into sub parts along the loop at the separated-points A to G neighboring to the individual modules FIM 1005, BCM 1014, PDM 1020, RIM 1029, DDM 1018 and IPM 1017. The sub parts include the individual electric conductive parts, 1c-A, 1c-B, 1c-C, 1c-D, 1c-E, 1c-F and 1c-G in the clockwise as shown in the figure.

At first, the line 1040 extracted through the fusible link 4 from the plus-side terminal of the battery 1003 is connected to the electric power line 1a of the electric power cable 1001 at the point G, and thus, the plus-side terminal of the battery 1003 is connected to the electric power line 1a.

Next, the electric power line 1a branches individually at the points A to F, and connects to the individual inputs of the electric power supply terminals for the modules FIM 1005, BCM 1014, PDM 1020, RIM 1029, DDM 1018 and IPM 1017.

With this configuration, electric power is supplied directly from the electric power line 1a to the individual modules.

As for the modules to which continuous electric power is not required, but is allowed to be supplied conditionally (for example, only if the ignition key switch is turned on), the modules connected to the electric power line 1a in the above mentioned manner supplies the electric power axially.

For example, electric power is supplied from FIM 1005 through the line 1041 to the modules and actuators such as PCM 1010 and ABS 1011 mounted inside the engine room. Similarly, electric power is supplied from BCM 1010 through the lines 1042 and 1043 to the actuators and sensors Such as RADIO (audio devices) 1104 and SIM 1025 mounted inside the cabin.

Thus, the electric power cable 1001 is arranged in a loop topology inside the automobile, and the modules to which the electric power is supplied directly from the electric power line 1a are arranged in a loop topology. The control modules from which the electric power is supplied to the modules, actuators and sensors such as FIM 1005 and BCM 1014, are arranged inside the engine compartment, the cabin and the trunk. With this configuration in this embodiment, it is possible to avoid use of a layout in which many electric power lines are arranged redundantly in parallel; and hence, the number of wire harness inside the automobile can be minimized.

In turn, using the above described configuration, when the electric power line is accidentally shorted to the vehicle body, the whole electric power supply to all the modules is shut down, which leads to the failure of almost all functions of the vehicle.

In order to resolve this problem, in this embodiment, necessary measures are provided for detecting the occurrence of any short circuit, and for preventing a functional failure in the automobile when there seems a possibility of a short circuit in the electric power line.

In this embodiment, as shown in FIG. 6, the electric conductive material 1c is provided in the electric power cable arranged in a loop topology, and used as a short sensor for detecting a short circuit as described later.

The electric conductive material 1c of the electric power cable 1001 is separated into sub parts along the loop at the separated points A to G, each point connected to the individual modules. The individual electric conductive material parts, 1c-A, 1c-B, 1c-C, 1c-D, 1c-E, 1c-F and 1c-G are defined on the closed loop in the clockwise direction as shown in the figure and are used as respective short sensors. The electric conductive material parts 1c-A to 1c-G branch at the point where the electric power line 1c branches, and they connect to the individual modules.

The individual module connected to the electric power line 1a has a circuit for detecting an abnormality of the individual short sensor.

The one terminal of the electric conductive material part 1c-A branches at the point A and connects to the short sensor abnormality detection circuit and the Is/O communication 1C (designated "abnormality detection circuit") 1110 of FIM 1005; and another terminal of the electric conductive body part 1c-A connects to the one terminal of the electric conductive part 1c-G at the point G, and another terminal of the electric conductive material part 1c-G opens at the point F.

Therefore, the abnormality detection circuit 1110 of FIM 1005 operates as a short sensor defined as a electric conductive material part between the point A and the point F.

The abnormality detection circuit 1124 of BCM 1014 is connected to the electric conductive material part 1c-B between the point B and the point A, and is used as a short sensor.

Similarly, the abnormality detection circuit 1140 of PDM 1020 is connected to the electric conducive body part 1c-C between the point C and the point B; the abnormality detection circuit 1116 of RIM 1029 is connected to the electric conductive material part 1c-D between the point D and the point C; the abnormality detection circuit 1133 of DDM 1018 is connected to the electric conductive body part 1c-E between the point E and the point D; and the abnormality detection circuit 1147 of IPM 1017 is connected to the electric conductive material part 1c-F between the point F and the point E, in which the individual electric conductive material parts 1c are used as short sensors.

Figure 34:
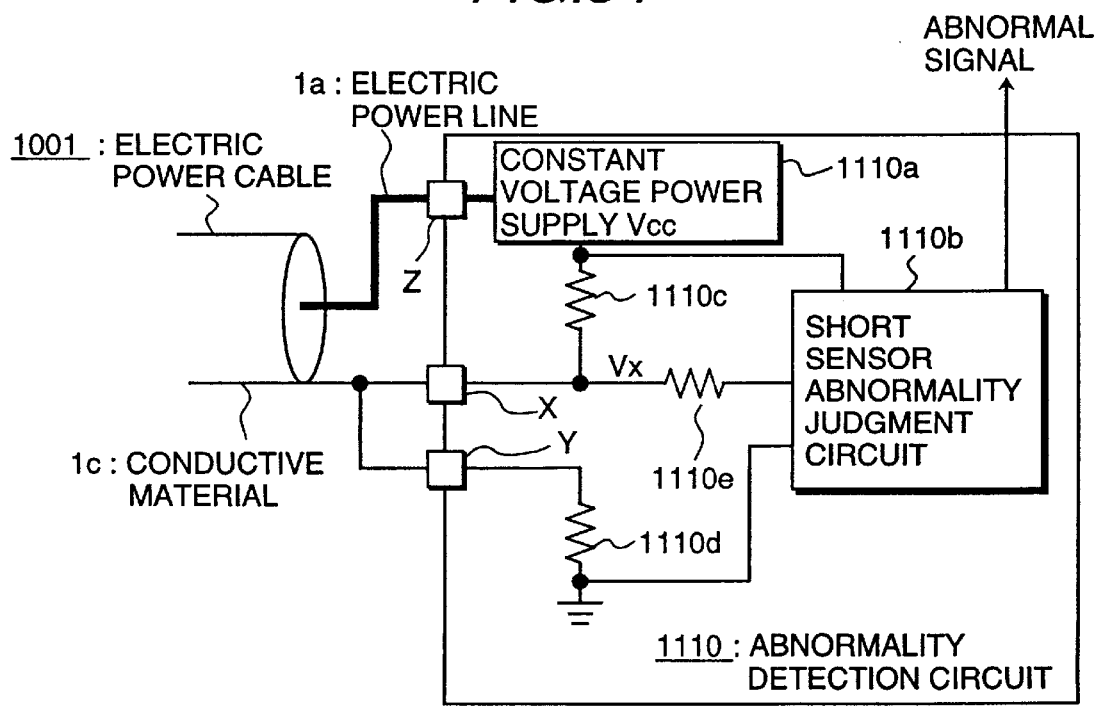
FIG. 34 is a block diagrams showing an embodiment of an abnormality detection circuit used in the present invention.

Next, referring to FIG. 34, the individual abnormality detection circuits 1110, 1124, 1140, 1116, 1133 and 1147 are described with the representative example of the abnormality detection circuit 1110 of FIM 1005.

Though each abnormality detection circuit contained in the individual module includes an Is/O communication 1C, the Is/O communication 1C is not shown in the figure.

As shown in FIG. 34, the abnormality detection circuit 1110 comprises a constant voltage power supply 1110a, the short sensor abnormality judgment circuit nob, resistance 1110c, 1110d and 1110e, and is connected to the electric power line 1a and the electric conductive material 1c of the electric power cable 1001 through the connector terminals x, Y and Z.

The constant voltage power supply 1110a receives the battery voltage from the electric power line 1a, and generates a designated constant value of voltage Vcc, for example, 5 V.

The short sensor abnormality judgment circuit 1110b is composed of a voltage comparator circuit for comparing the voltage Vx (to be supplied through the resistance 1110e) with the designated reference voltage Vs (Vs=Vcc/2). It judges the level of the input voltage Vx, using the reference voltage Vs as a threshold value; if the input voltage Vx is less than the reference voltage Vs (that is, Vx<Vs), the occurrence of an abnormality is reported, and then a designated abnormality signal is generated.

The resistance 1110c and the resistance 1110d form a voltage separation circuit, which divides the voltage Vcc put out from the constant voltage power supply 1110a into the half of Vcc, and supplies the divided voltage Vx to the connector terminal X.

The voltage division ratio is defined by setting the resistances 1110c and 1110d so that the relation Vx ? Vs may be satisfied.

The resistance 1110e is used for circuit protection.

Next, the operation of the abnormality detection circuit 1110 is described.

The electric conductive body 1c of the electric power cable 1 is separated from the electric power line 1a by the insulation material 1b, and is shielded by the insulation material 1d. Therefore, the electric conductive material 1c is usually insulated from the material of the vehicle when installed inside the body of the vehicle.

In the normal operation condition, the electric current flowing into the electric conductive material 1c does not occur despite the fact that the voltage Vx is applied to the connector X; as a result, the voltage of the electric conductive material 1c relative to the earth (the body of the vehicle), that is, the electric potential of the electric conductive material 1c, is maintained to be the voltage Vx at the connector terminal x and hence, the relation Vx a Vs is satisfied. Therefore, the short sensor abnormality judgment circuit 1110b does not generate an abnormality signal.

However, when the electric conductivity occurs accidentally between the electric conductive material 1c and the earth, an electric current flows from the connector terminal x to the electric conductive material 1c. As a result, the voltage drop in the resistance 1110c increases, and the voltage at the connector terminal x decreases below Vx.

As a result, the relation Vx>Vs is not satisfied any more; rather the relation Vx<Vs is effected and an abnormality signal is generated by the short sensor abnormality judgment circuit 1110b. Thus, the occurrence of the abnormality is reported.

As found explicitly in FIG. 33, the electric conductive body 1c of the electric power cable 1 is separated from the electric power line 1a by the insulation material 1b, and surrounds the insulation material 1b. As the outer surface of the electric conductive material 1c is shielded by the insulation material 1d, when the electric power line 1a shorted to the ground, the insulation structure of the insulation material 1d relative to the ground becomes broken down at first and the short between the electric conductive material 1c and the ground, and the emerged and precursor phenomena of electric conductivity between usually insulated material are necessitated.

In other words, as long as the insulation structure of the insulation material 1d relative to the ground is not broken, and electric conductivity between them does not occur, there is no possibility that the electric power line 1a makes short to the ground.

Therefore, according to this embodiment, short circuit is detected when electric conductivity is found between the insulation material 1d of the electric power cable 1001 and the earth. Accordingly, the possibility of the occurrence of a short circuit in the electric power line 1a can give a good information to report the abnormality and that the short circuit in the electric power line 1a can be prevented beforehand.

In this embodiment, at the part where the closed loop of is the electric power line 1a is formed, the electric conductive body 1c in the electric power cable 1001 are separated into the independent electric conductive parts 1c-A, 1c-B, 1c-C, 1c-D, 1c-E, 1c-F and 1c-G, corresponding to each of the abnormality detection circuits 1110 of the individual modules.

Therefore, according to this embodiment, the circuit which, among the abnormality detection circuits 1110 for the individual modules, detects the abnormality, indicates accurately the location of the abnormality on the closed loop for the individual electric conductive parts 1c-A, 1c-B, 1c-C, 1c-D, 1c-E, 1c-F and 1c-G.

Thus, when the abnormality is detected and the abnormality occurrence position is identified, the data relevant to this abnormality information are stored in a designated memory, or transferred to another module or diagnostic tools through the communication lines if necessary.

With this operation, the driver and the dealer can easily recognize the occurrence of an abnormality and identify the position of the abnormality.

Therefore, according to this embodiment, as the short sensor is shorted to the ground and detects the short circuit, it reports this phenomena to the diver before the symptom for the short between the electric power line and the ground may arise. The abnormality can thus be recognized before it affects the overall functions of the automobile; and hence, the abnormality can be resolved simply by fixing the specified and localized abnormal part.

In this embodiment as shown in FIG. 34, the resistance 1110d, which is connected to the ground and is used for the voltage division, is not connected directly to the resistance 1110c in the abnormality detection circuit 1110; rather its terminal is connected to the connector terminal Y, and is thereby connected externally to the connection line of the electric conductive body 1c outside. With this circuit configuration, the electric current flowing from the constant voltage circuit 1110a through the resistance 1110c and not to the ground, is forced to flow in the contact part of the connector terminal X.

As is well known, the cable connector has a contact part composed of metallic contact points. Therefore, in using the cable connector, there may be danger of a contact function failure due to the oxidization of the contact parts.

In this embodiment, because the electric current always flows thorough the connector, oxidization of the contact point can be reduced sufficiently. As a result, functional failure of the abnormal detection circuit due to contact point failure can be definitely prevented and thus, high reliability can be achieved.

Referring to FIGS. 30A to 30C, the component 1004 is a multiplex communication line, which is used for exchanging data among the modules. With this configuration, in this embodiment, the function of a intensive wiring apparatus can be obtained.

As shown in the figure, the multiplex communication line 1002 is also arranged in a loop topology in the automobile, and branches at the position nearest to the individual module, extending and connecting to the individual module.

For example, in this embodiment, FIM 1005 connects at the point H on the communication line 1002; BCM 1014 connects at the point K on the communication line 1002; and RIM 1029 connects at the point N on the communication line 1002, respectively.

Therefore, according to this embodiment, because the individual module is located closest to the device to be connected, and because the input data and the output data of the device which is not connected directly to the individual module itself are transmitted and received through the multiplex communication line 2, there is no need to connect between the individual module and its remotely situated target device through a separate line. Therefore, the amount of harness wire can be reduced further.

Next, the structure of the individual modules will be described.

FIM 1005 is composed of the constant voltage power circuit 1106 for supplying a constant voltage to the control circuit, the electric power supply circuit 1108 for supplying the electric power to the external load drive circuit 1107, the electric power supply circuit 1109 for supplying the electric power to PM and ABS and the external loads, the short sensor abnormality detection circuit and Is/O communication 1C 110 described above, and the input circuit 111.

The constant voltage power circuit 1106 and the electric power supply circuits 1108 and 1109 connect to the fusible link 1004 through the electric power line 1a of the electric power cable formed in a loop topology, and finally connect to the plus-side terminal of the battery 3.

Next, the electric power supply circuit 1108 controls the electric power supply to the external load drive circuit 107 in response to the data obtained by communication. It also detects the electric current flowing into the electric power supply circuit 1108 itself, and interrupts the electric power supply to itself when excess current arises.

Therefore, even if a short circuit in the external load and the drive circuit cannot be isolated, a continued flow of excess current into the electric power supply circuit 108 can be avoided by isolating the electric power supply circuit 108.

The electric power supply circuit 109 controls the electric power supply to the external modules PCM and ABS in response to the data obtained through the communication line 1002. It also detects the electric current flowing into the electric power supply circuit 1109 itself, and interrupts the electric power supply to itself when excess current flows.

Therefore, even if the external load is damaged or fails to operate normally, a continued flow of excess current into the electric power supply circuit 1109 can be avoided by isolating the electric power supply circuit 1109.

The short sensor abnormality detection circuit and Is/O communication 1C 1110 are connected to the short sensor and the communication line, and detect any abnormality of the short sensor and exchange data with another module.

The electric power supply circuits 1108 and 1109 are turned ON and OFF in responsive to the data received by the Is/O communication 1C 1110.

The external load drive circuit 107 is connected to the actuator 113 for the head lamp and the hone mounted near FIM 1005, and drives the actuator 1113 in response to the signal from the Is/O communication 1C 110.

The input circuit 1111 transfers the signal 111 supplied to FIM to the Is/O communication 1C 1110.

Similarly to FIM 1005, RIM 1029 is composed of the constant voltage power circuit 1114, the electric power supply circuit 1115, the short sensor abnormality detection circuit and Is/O communication 1C 116, the input circuit 118 and the external load drive circuit 117.

The external load drive circuit 117 is connected to the actuator 1120 for the tail lamp, the trunk opener and the rear defogger mounted near RIM 1029, and drives the actuator 1120 in response to the signal supplied by the Is/O communication 1C 1116. The input circuit 1118 transfers the signal from the external load to the Is/O communication 1C 1116.

BCM 1014 is composed of the constant voltage power circuit 1121, the electric power supply circuit 122, the electric power supply circuit 1123, the short sensor abnormality detection circuit and Is/O communication 1C 124, CPU 125, the input circuit 1127 and the external load drive circuit 1128.

BCM 1014 is mounted near the driver's seat dashboard, and its input circuit 1127 is connected to the switches and sensors mounted around the driver's seat, for example, for switching the ignition key signal and so on, and its external load drive circuit 1128 is connected to the actuator 1130.

With this circuit configuration, BCM 1014 manages intensively and controls the switching of the electric power supply from the electric power supply circuits 1108, 1109 and 1115 for FIM 1005 and RIM 1029, and the input and output signals of FIM 1005, RIM 1029, DDM 1018, PDM 1020 and IPM 1017.

Electric power is supplied to the modules, for example, RADIO 1104 and SUM 1025, and their related sensors from the electric power supply circuit 1123 in response to the operation status of the ignition key switch.

The short sensor abnormality detection circuit and Is/O communication 1C 1124 exchanges data with another module.

And furthermore, CPU 1125 captures the input data which it receives directly and the data received by other modules at the communication 1C 1124, and performs arithmetic procedures in response to the captured data. It also outputs the drive signal for the actuator connected directly to in response to the arithmetic operation result. Finally, it transmits the arithmetic operation result through the communication 1C 1124 to another module.

DDM 1018 and PDM 1020 are modules mounted inside the door. Each is composed of the constant voltage power circuits 1131 and 1138, the electric power supply circuits 1132 and 1139, the short sensor abnormality detection circuits and Is/O communication 1C's 1133 and 1140, the input circuits 1134 and 1141, and the external load drive circuits 1135 1142, respectively. Their functions are similar to those of FIM 1005 and RIM 1029.

The input and output devices of DDM 1018 and PDM 1020 include the actuators 1137 and 1144 for the door lock motor and the power window (p/W) motor, and the switches 1136 and 1143 for the P/W switches and door lock switches.

IPM 1017 is a module mounted inside the instrument panel meter, and has the exact same structure with DIM 1018 and PDM 1020. Its input and output signals include the output signal to the actuator 1151(such as monitor and alarm lamps mounted inside the panel) and the input signals from the switches in the panel and the sensor 1150.

PCM 1010, ABS 1017, RADIO 1104 and SDM 1025 are composed of the electric power circuits 1152, 1159, 1167 and 1174, the communication 1C's 1153, 1060, 1068 and 1175, CPU's 1154, 1161, 1169 and 1176, the input circuits 1155, 1162, 1170 and 1177, and the external load drive circuits 1156, 1163, 1171 and 1178, respectively.

Those modules have CPU's, and performs arithmetic operations and communication control for their specified control devices. The electric power circuit 1152, 1159, 1167 and 1174 receive the electric power supplied by BCM 1014, RIM 1029 and FIM 1005 and supply the electric power to the electric power supply of the individual module and to the actuators and the sensors. The communication 1C's 1153, 1160, 1168 and 1175 are connected to the communication line 1002 and exchange data with another module.

The external load drive circuit 1156, 1163, 1171 and 1178 are connected to the actuators 1158, 1165, 1173 and 1180 including the injector, the solenoid and the blower motor mounted at closer positions, and drive those actuators in responsive to the arithmetic operation results of their corresponding CPU's. The input circuits 155, 162, 170 and 177 transfers the input signals 1157, 1164, 1172 and 1179 to CPU's 1154, 1161, 1169 and 1176, respectively.

Figure 31:
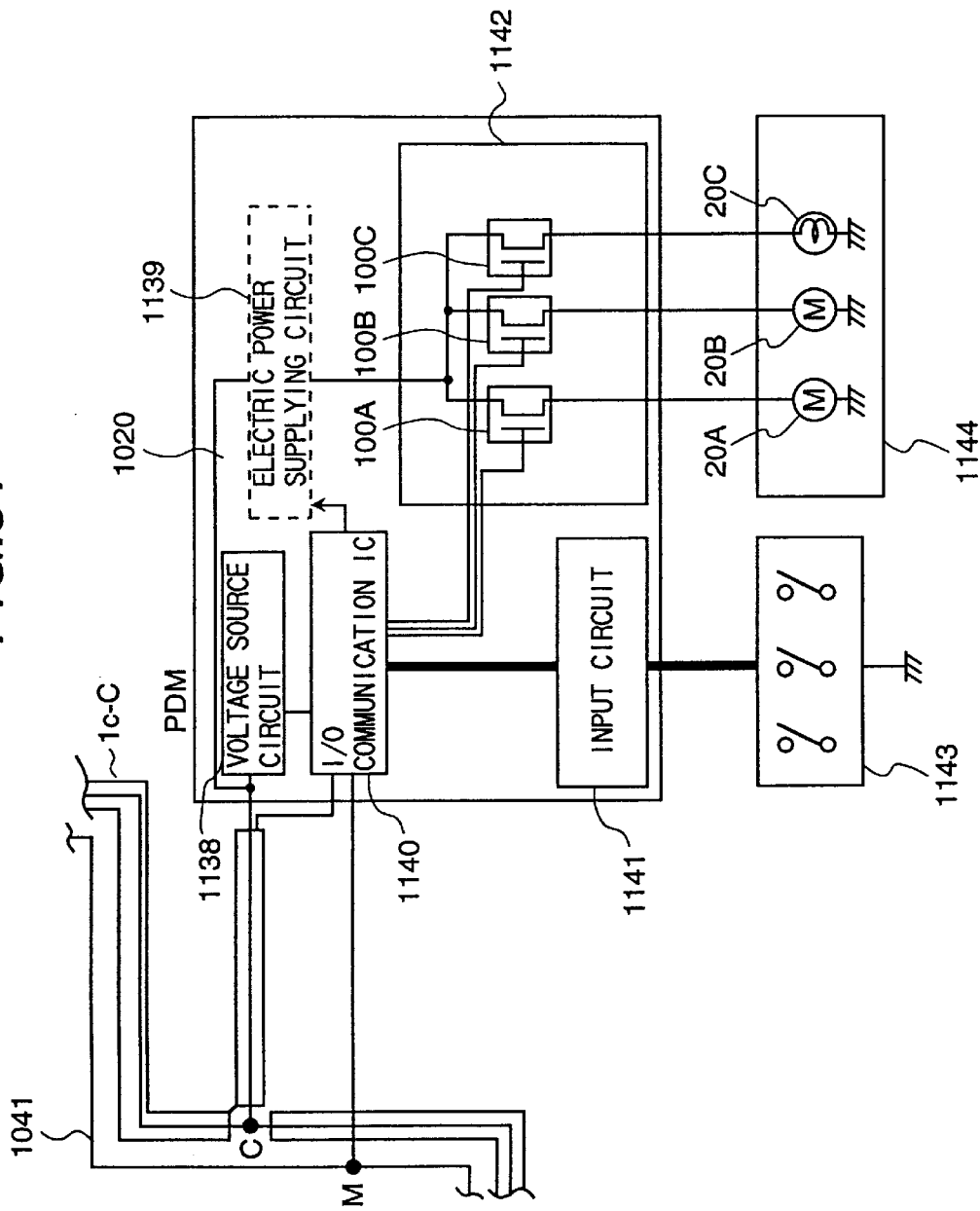
FIG. 31 is an enlarged view of an embodiment of the module used in the present invention.

Furthermore, another embodiment of a module of the electric power supply apparatus used according to the present invention will be explained as follows. FIG. 31 shows the module which is enlarged and comprises a constant voltage source circuit 1138, an electric power supplying circuit 1139, an abnormality detecting circuit for detecting an abnormality of a short circuit detecting sensor and Is/O communication 1C 1140, an input circuit 1141 and an external load actuating circuit 1142. The functions thereof is the same as those in the circuit of the FIM and the RIM. The input and output signals for the module of the electric power supply apparatus are input and/or output from/to the actuator 1144 such as a door lock motor or a power motor installed in the door, switches 1143 for the power window or the door locking etc.

An external actuating circuit 1142 installed inside of the PDM 1020 comprises power elements I00A, 100B, 100C with a temperature protective function, and actuates a power window motor 20A, the door lock motor 20B, and a curtain lamp 20C mounted on the door.

When the power window switch is actuated, the abnormality detecting circuit for detecting the abnormality of the short circuit detecting sensor and the Is/O communication 1C 1140 outputs an encoded signal for actuating the power window from the input circuit 1141 to the communication line. Receiving the signal actuating the power window, the BCM 1014 judges whether the power window is capable of being actuated or not, and when it is it transmits the signal for actuating the power window to the PDM 1020. The signal received by the PDM 1020 is input to the abnormality detecting circuit for detecting the abnormality of the short circuit detecting sensor and the Is/O communication 1C 1140, and is decoded to an actuating signal for actuating the power window. The abnormality of the short circuit detecting sensor and the Is/O communication 1C 1140 outputs a control signal so as to control the power element 100A with a temperature protective function actuating the power window installed in the external actuating circuit 1142. The power element 100A with a temperature protective function receiving the control signal enters a conductive state so as to apply electric power from the supply circuit 1139 to the motor 200A for the power window. In this way the power window is actuated and the power element 100A with a temperature protective function has an important function in the above system.

Figure 32:
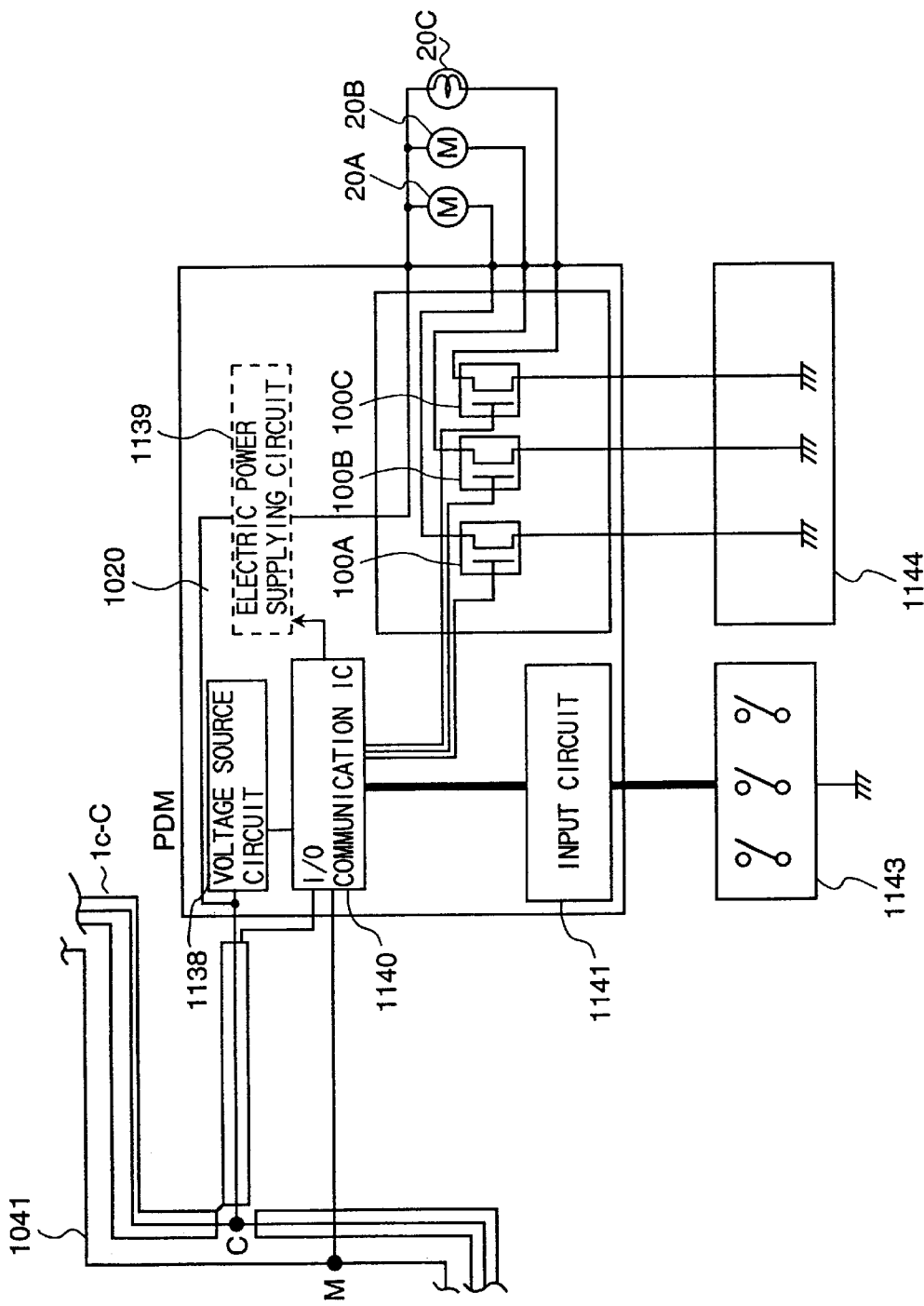
FIG. 32 is an enlarged view of an another embodiment of the module used in the present invention.

On the other hand, an embodiment shown in FIG. 32 shows a case in which channel polarity of the electric power element 100 installing an over-heating detecting element therein in FIG. 31 is exchanged from P channel to N channel. Therefore, positions of the electric power element 100 installing an over-heating detecting element and the load 304 are replaced, however the embodiment shown in FIG. 32 operates in the same as that in FIG. 31.

According to this embodiment, it will be appreciated that various kinds of electric equipment can be controlled with a substantially reduced number of electric cables compared to the number of individual modules and actuators, with high reliability and accuracy. Also, the scale of the wire harness can be reduced easily, even if the number of electric equipment increases.

According to this embodiment, a potential indicative of the occurrence of a short circuit at a specific position on the electric power line configured in a loop topology can be detected definitely, and detection information can be reported to the driver. A reduction of the number of electric power cables is achieved, and an abnormality of the vehicle can be recognized before the overall function of the electric loads is impaired, and the abnormality parts are so localized as to be easily fixed or exchanged.

As explained above, according to this embodiment, power consumption can be reduced.

Each embodiment of the present invention is explained using MOSFET as a switching element. However, another electric power element including MISFET, IGBT, and a bipolar transistor may be used.

Each component in each embodiment of the present invention may be structured on the same chip as that of the electric power element, or may be structured on a different chip, on a semiconductor board, on a insulator board, on a or on a conductor board.

Each component in each embodiment of the present invention may be realized by hardware or may comprise an advanced function processing unit such as a microcomputer and be realized by software.

According to the present invention, the switch circuit having a protection function does not repeat the unnecessary ON-OFF cycle.

The foregoing disclosure has been set forth merely to illustrate the invention and is not intended to be limiting.

Since modifications of the disclosed embodiments incorporating the spirit and substance of the invention may occur to persons skilled in the art, the invention should be construed to include everything within the scope of the appended claims and equivalents thereof.

What is claimed is:

1. A switch circuit having protection function comprising:
    an electric power element for receiving a control signal via a switch and supplying power from a power source to a load according to said control signal;
    temperature detecting means for detecting the temperature in the neighborhood of said electric power element; and
    control means for opening said switch so as to interrupt input of said control signal to said electric power element when said temperature detected by said temperature detecting means exceeds a predetermined temperature; wherein
        said control signal includes periodic starting points for turning on and off, and
        said switch circuit further comprises interruption status retaining means for retaining an interruption status of said switch, in which input of said control signal to said electric power element is interrupted, and for releasing said interruption status after said temperature detected by said temperature detecting means no longer exceeds said predetermined temperature, at a next occurring starting point of said signal.

2. A switch control having protection function according to claim 1, wherein
    said interruption status retaining means is provided in said control means.

3. A switch circuit having protection function according to claim 1, wherein
    said interruption status retaining means is provided in said temperature detecting means.

4. A switch circuit having protection function according to claim 1, wherein
    said switch circuit further has resetting means for canceling said interruption status of said switch.

5. A switch circuit having protection function according to claim 4, wherein
    said resetting means cancels said interruption status of said switch in response to occurrence of a periodic component of said control signal.

6. A switch circuit having protection function according to claim 4, wherein
    said resetting means cancels said interruption status when said temperature detected by said temperature detecting means becomes the predetermined interruption canceling temperature.

7. A switch circuit having protection function according to claim 4, wherein
    said switch circuit further has reset stopping means for stopping a reset operation of said resetting means when a predetermined time elapses after input of said control signal to said electric power element is interrupted.

8. A switch circuit having protection function according to claim 1, wherein said switch circuit further has input controller means for superposing a reset signal for performing said reset operation on a signal inputted to said electric power element in the predetermined timing and inputs an output signal of said input controller means to said electric power element.

9. A switch circuit having protection function according to claim 8, wherein said input controller means superposes said reset signal only during the term that said control signal energizes said electric power element.

10. A switch circuit having protection function according to claim 8, wherein said input controller means superposes said reset signal during the whole term of said control signal.

11. A switch circuit having protection function according to claim 8, wherein said reset signal is superposed on said signal in a timing whose interval increases gradually.

12. A switch circuit having protection function according to claim 1, wherein said switch changes over the path through which said control signal is supplied to said electric power element and the path for setting the control terminal of said electric power element at the grounding potential.

13. A switch circuit having protection function according to claim 1, wherein said switch changes over a path through which said control signal is supplied to said electric power element and a discharge path for connecting to the current source for dissipating a charge of a control terminal of said electric power element.

14. The switch circuit according to claim 1, wherein said temperature detecting means detects the temperature of a PN junction of said electric power element.

15. A switch circuit having protection function comprising:
    an electric power element for receiving a control signal via a switch and supplying power to a load according to said control signal;
    temperature detecting means for detecting the temperature in the neighborhood of said electric power element; and
    control means for opening said switch so as to interrupt input of said control signal to said electric power element when said temperature detected by said temperature detecting means exceeds a first predetermined temperature;
    wherein said switch circuit further comprises interruption status retaining means for retaining an interruption status of said switch, in which input of said control signal to said electric power element is interrupted, and said control means closes said switch, releasing said interrupt status, after said temperature detected by said temperature detecting means decreases to a second predetermined temperature which is lower than said first predetermined temperature, at a next occurring rising time of said signal.

* * * * *